United States Patent [19]
Shiota et al.

[11] Patent Number: 5,680,059
[45] Date of Patent: Oct. 21, 1997

[54] ABNORMALITY DETECTING METHOD AND APPARATUS FOR ELECTRIC EQUIPMENT, PARTICULARLY FOR A ROTATING ELECTRIC MACHINE

[75] Inventors: Tetsu Shiota; Hideki Tokura; Kenji Morimoto; Takaho Tanaka, all of Osaka; Yoshiharu Kaneda, Hyogo; Keiichi Itoh, Hyogo; Ken Kimura, Hyogo; Shigeo Kitamura, Hyogo, all of Japan

[73] Assignees: The Kansai Electric Power Co., Inc., Osaka; Mitsubishi Denki Kabushiki Kaisha, Tokyo, both of Japan

[21] Appl. No.: 359,427

[22] Filed: Dec. 20, 1994

[30] Foreign Application Priority Data

Feb. 25, 1994 [JP] Japan .................... 6-027741

[51] Int. Cl.[6] .................. G01R 23/00; G01R 31/02
[52] U.S. Cl. ........................... 324/772; 324/547
[58] Field of Search ..................... 324/772, 545, 324/158.1, 73.1, 547, 546; 340/648; 364/550.01; 318/490, 434; 322/99; 310/214, 220

[56] References Cited

U.S. PATENT DOCUMENTS

| | | | |
|---|---|---|---|
| 2,654,860 | 10/1953 | Lewis | 318/490 |
| 3,896,376 | 7/1975 | Sinniger | 324/772 |
| 4,123,009 | 10/1978 | Kilpinen | 324/772 |
| 4,377,784 | 3/1983 | Saito et al. | 324/772 |
| 4,737,775 | 4/1988 | Tokuda et al. | 324/547 |
| 4,779,051 | 10/1988 | Grunewald et al. | 324/536 |
| 4,814,699 | 3/1989 | Koziel et al. | 324/545 |
| 4,949,001 | 8/1990 | Campbell | 310/220 |
| 4,965,513 | 10/1990 | Haynes et al. | 318/490 |
| 5,006,769 | 4/1991 | Posedel | 318/434 |
| 5,075,629 | 12/1991 | Umemura et al. | 340/646 |

FOREIGN PATENT DOCUMENTS 4-296672  10/1992  Japan .

OTHER PUBLICATIONS

G. C. Stone, et al "Practical Implementation of Ultrawideband Partial Discharge Detectors" 1992 IEEE.

G. C. Stone, "Partial Discharge—Part VII: Practical Techniques for Measuring PD in Opereating Equipment" IEEE Jul./Aug. 1991.

*Primary Examiner*—Vinh P. Nguyen
*Attorney, Agent, or Firm*—Wolf, Greenfield & Sacks, P.C.

[57] ABSTRACT

The abnormality detecting method and apparatus for electric equipment measure the frequency spectrum of a signal detected by a partial discharge sensor 9, and detect a partial discharge signal having a frequency component in the neighborhood of a resonance frequency determined on the basis of the electric equipment and its measuring circuit, then detect the abnormality of the electric equipment. In a rotating electric machine particularly, the narrow band filter circuit 23 passes a frequency component around a resonance frequency determined on the basis of the length of the stator core to detect a partial discharge signal from the passed signal.

3 Claims, 25 Drawing Sheets

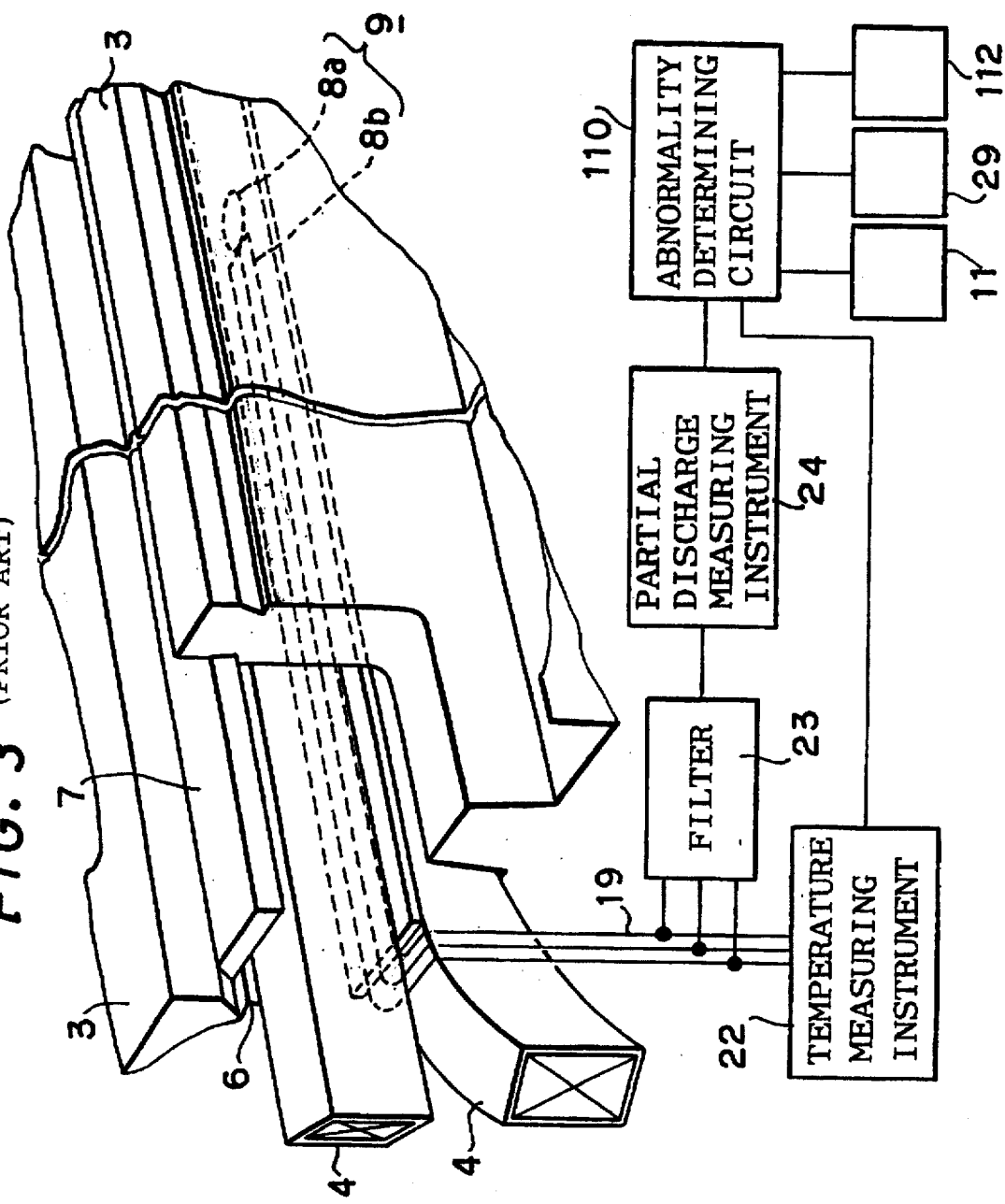

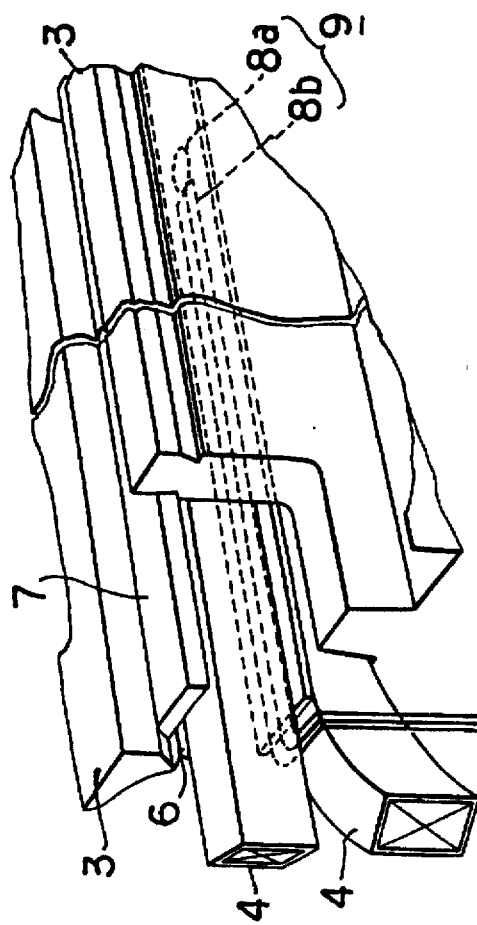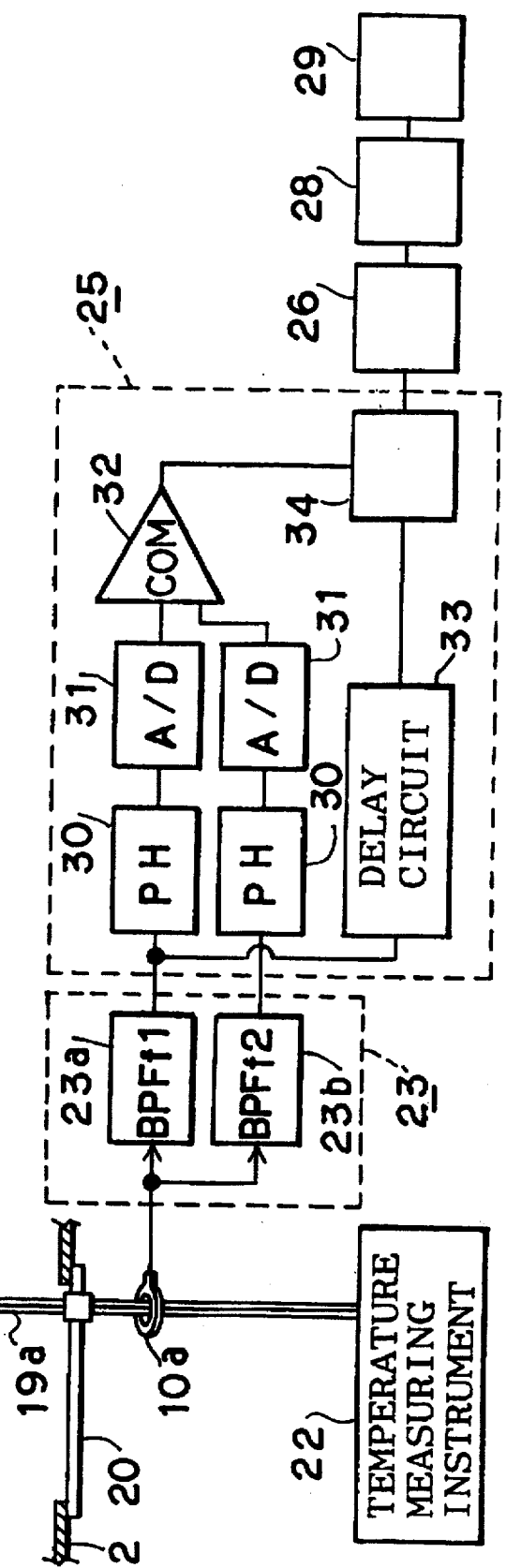
FIG.17

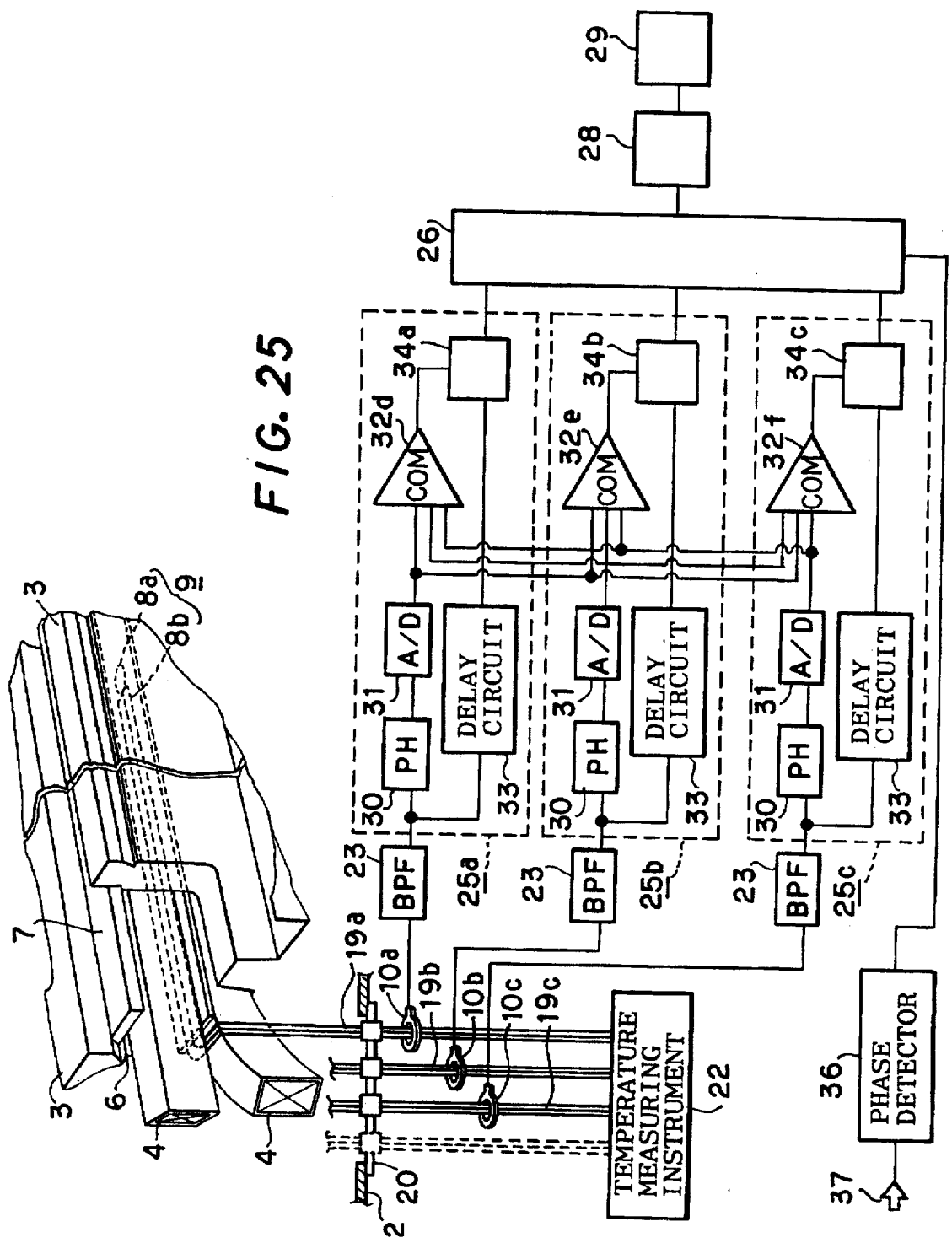

SIGNAL OF DISCHARGE SENSOR 9a

SIGNAL OF DISCHARGE SENSOR 9b

SIGNAL OF DISCHARGE SENSOR 9c

FIG. 32

| COMPARED SENSORS | COMPARED RESULTS | JUDGMENT |
|---|---|---|
| COMPARISON OF U-PHASE AND V-PHASE | L1 < U-PHASE / V-PHASE DETECTION OF U-PHASE ALONE | PARTIAL DISCHARGE IN U-PHASE |
| | L1 > U-PHASE / V-PHASE > L2 | RADIO NOISES OR PARTIAL DISCHARGE IN W-PHASE |
| | U-PHASE / V-PHASE > L2 DETECTION OF V-PHASE ALONE | PARTIAL DISCHARGE IN V-PHASE |
| COMPARISON OF V-PHASE AND W-PHASE | L1 < V-PHASE / W-PHASE DETECTION OF V-PHASE ALONE | PARTIAL DISCHARGE IN V-PHASE |
| | L1 > V-PHASE / W-PHASE > L2 | RADIO NOISES OR PARTIAL DISCHARGE IN U-PHASE |
| | V-PHASE / W-PHASE > L2 DETECTION OF W-PHASE ALONE | PARTIAL DISCHARGE IN W-PHASE |
| COMPARISON OF W-PHASE AND U-PHASE | L1 > W-PHASE / U-PHASE DETECTION OF W-PHASE ALONE | PARTIAL DISCHARGE IN W-PHASE |
| | L1 > W-PHASE / U-PHASE > L2 | RADIO NOISES OR PARTIAL DISCHARGE IN V-PHASE |
| | W-PHASE / U-PHASE > L2 DETECTION OF U-PHASE ALONE | PARTIAL DISCHARGE IN U-PHASE |

ABNORMALITY DETECTING METHOD AND APPARATUS FOR ELECTRIC EQUIPMENT, PARTICULARLY FOR A ROTATING ELECTRIC MACHINE

BACKGROUND OF THE INVENTION

1. Field of the Invention

This invention relates to a method and an apparatus for detecting the abnormality of electric equipment, especially for a rotating electric machine such as an electric motor, a generator and so on, in particular, relates to a method and an apparatus for detecting the abnormality caused by the insulation aging of a stator winding.

2. Description of the Prior Art

Recently, the scale of a plant in an industry has generally been enlarging, and electric equipment such as a gas insulated system (hereinafter referred to as GIS) and a rotating electric machine, too, has been becoming larger in size, and the number of the installation of it has also been enlarging accordingly.

Because high reliability is required in such electric equipment, it is needed to surely practice the maintenance and the inspection of such equipment to prevent a sudden accident such as a dielectric breakdown. Besides, the greater part of the electric equipment manufactured during the high economic growth period in Japan has been operated for more than twenty-five years, then it is very highly requested to continuously keep supervising on it for preventing a sudden accident while it is operated.

Conventionally, there has been used an electrical method as a method for judging the insulation aging of electric equipment, for example, as regards the stator of a rotating electric machine, which electrical method imposes a high voltage on the winding of the rotating electric machine after the operation of the machine was stopped, and measures the electrical characteristics of the stator such as insulation resistance, AC current, dielectric loss angles, partial discharge and the like to estimate the degree of the aging of insulators in each part.

However, for making the judgement about the aging by the use of such a conventional method, it is required to stop the operation of electric equipment, and consequently, a great deal of time, labor and expenditure are required. Furthermore, the method has a defect that it is difficult to practice the judging tests of aging frequently. And it has another defect that it cannot fully cope with a case where the aging rapidly advances.

Accordingly, there is a prior art apparatus disclosed in the Japanese Patent Gazette No. 68852 / 92 (Hei. 4) for eliminating the problems described above. This apparatus provides a sensor electrode made of a metal material in the neighborhood of the stator coil in a slot, and connects a partial discharge measuring instrument to the sensor electrode for supervising the insulation aging during the operation of the electric equipment. Besides, Japanese Unexamined Patent Application Published under No. 296672 / 92 (Hei. 4) discloses an abnormality detecting apparatus which detects the high frequency signals induced by the partial discharge generated in its stator winding and propagated through the stator winding by the use of a temperature detector provided at a place adjoining the stator winding for detecting the abnormality of the winding of the stator.

FIG. 1 is a sectional view showing a main part of a prior art corona detecting apparatus for a high voltage rotating electric machine, which is disclosed in, for example, Japanese Patent Gazette No. 68852 / 92 (Hei 4). In the figure, reference numeral 3 designates a stator core, reference numeral 4 designates a stator winding, reference numeral 6 designates a slot, reference numeral 100 designates a stator winding conductor, reference numeral 101 designates a main insulating layer, reference numeral 102 designates a low resistance coated film which is provided on the surface of the main insulating layer 101, reference numeral 103 designates an inter-layers separating segment, reference numeral 104 designates a sensing electrode, reference numeral 106 designates a lead, and reference numeral 107 designates a corona measuring instrument. The sensing electrode 104 made of a metal material is electrically connected with the low resistance coated film 102 in the slot 6 of the stator core 3. The corona detecting apparatus supervises the insulation aging during the operation of the rotating electric machine by providing the sensing electrode 104 between the stator windings 4 housed in the slot 6 through the inter-layers separating segment 103 and by connecting the lead 106 drawn out of the sensing electrode 104 to the corona measuring instrument 107.

FIG. 2 is a sectional view showing the main part of another example of a prior art corona detecting apparatus. In this apparatus, the low resistance coated film 102 is divided in to parts 108 and 109, and one part 109 of them is contacted with the sensing electrode 104.

Next, the operation will be described thereof.

When insulation aging is happened in the high voltage rotating electric machines, which are shown in FIG. 1 and FIG. 2, partial discharge is generated at the main insulating layer 101 between the stator winding conductor 100 and the low resistance coated film 102. Because the sensing electrode 104, which is made of a metal material, is electrically connected with the low resistance coated film 102 in the slot 6, the partial electric discharge generated during the operation of the rotating electric machine can be detected by the sensing electrode 104.

Moreover, the apparatus shown in FIG. 2 is composed so as to divide the low resistance coated film 102 into the parts 108 and 109, and so as to contact the sensing electrode 104 with one part 109 of them. Consequently, the generated partial discharge can be detected from the part 109 of the low resistance coated film 102, which part 109 is insulated from the stator core 3, even if the part 108 of the low resistance coated film 102 is contacted with the stator core 3 electrically.

Furthermore, FIG. 3 illustrates a block diagram showing a prior art abnormality detecting apparatus for a rotating electric machine disclosed in Japanese Unexamined Patent Application Published under No. 296672 / 92 (Hei. 4). The drawing also illustrates a rotating electric machine partially broken away for showing the position of a partial discharge sensor which is installed in the proximity of stator windings.

In the drawing, the stator windings 4 are housed in the slot 6 formed in the stator core 3 which is fixed to a stator frame (not shown). The stator windings 4 are composed of two windings, upper one and lower one, and fixed by a wedge 7. A partial discharge sensor 9 is composed of, for example, a temperature detecting element 8a and lead wires 8b, and the sensor 9 is inserted between the two, the upper and the lower, stator windings 4 in a predetermined slot 6. The lead wires 19 of the partial discharge sensor 9 are connected with an abnormality determining circuit 110 through a temperature measuring instrument 22. The lead wires 19 are connected with the abnormality determining circuit 110 further through a filter 23 and a partial discharge measuring instrument 24. An alarm unit 11, an abnormality displaying unit 29 and an interface circuit 112 are also connected with the abnormality determining circuit 110.

Next, the operation of the prior art abnormality detecting apparatus shown in FIG. 3 will be described.

When an abnormality due to the insulation aging of the stator windings 4 happens, partial discharge is generated in the stator windings 4 and a high frequency current flows in the windings 4. The high frequency current generated by the discharge is propagated to the partial discharge sensor 9, too, which is connected with the upper and lower stator windings 4 electromagnetically, and the current is inputted into the filter 23. Since the partial discharge signal is a high frequency signal having a frequency more than several Khz, the filter 23 eliminates low frequency signals to be used in temperature measurement and inputs only the high frequency component of the discharge signal to the partial discharge measuring instrument 24. The partial discharge measuring instrument 24 analyses the inputted signal to measure a discharge characteristic, and outputs the discharge characteristic to the abnormality determining circuit 110. If the abnormality determining circuit 110 determines the situation to be abnormal, the circuit 110 outputs alarm signals to the alarm unit 11 and the abnormality displaying unit 29.

Generally speaking, while electric equipment is operated, many radio noises accompanied by the operation are generated. For example, in many generators having used for more than 15–20 years, the insulation abnormalities of which generators are needed to be supervised, the exciters of the generators, which supply field current to the rotors of the generators, supply DC current to the rotors through the slip rings of the generators. In these slip rings, arc discharge is generated in some contact states of their slipping surfaces, and radio noises are, in turn, generated. Furthermore, in a thyristor exciter, pulse-shaped thyristor noises are superposed on the exciting current of it. The exciters and the slip rings thus become generation sources of radio noises.

Moreover, the charging caused by the static electricity of steam turbines and the charging caused by the shaft induced current accompanied by the generation of electricity and the like are generated in the rotors. For the sake of discharging the charges of the rotors, the construction to provide grounding brushes to the shafts of the rotors is generally used for discharging the charges to the ground. However, arc discharge is generated in some contact states of the slipping surfaces of the grounding brushes, and radio noises are generated during this discharging, too. These radio noises show the resembled frequency characteristics to those of electromagnetic wave signals caused by void discharge generated in the main insulating layers 101 of the stator windings 4 shown in FIG. 1 and FIG. 2.

Also, radio noises generated in isolated-phase buses, various kinds of radio communication waves, broadcast waves and so forth invade into power stations from transmission system sides. These radio noises are often detected by the sensor which detects the partial discharge, too. In particular, being a high sensitivity sensor to high frequency signals, the partial discharge sensor 9 shown in FIG. 3 shows the characteristic of detection of the radio noises, too.

These radio noises are detected in stronger strength than that of the partial discharge signals. Besides, the frequencies of the radio noises exist in a near zone to those of the partial discharge signals, and the fact makes the detection of the partial discharge during the operation of electric equipment very difficult.

Because the conventional abnormality detecting method for electric equipment, and the conventional abnormality detecting apparatus for a rotating electric machine are constructed as described above, they have had no regard to the radio noises generated during the operation of them.

Also, even if an operator tries to detect the signals generated by the partial discharge during the operation of them, the obtained measurement results would contains the radio noises because of the impossibility of separating the partial discharge from the radio noises. Consequently, the conventional abnormality detecting method and apparatus have a problem that the accuracy of its abnormality detection is resulted to be very low.

SUMMARY OF THE INVENTION

In view of the foregoing, it is an object of the present invention to provide an abnormality detecting method for electric equipment which method can specify the generation source of the discharge signals to be generated during the operation of the electric equipment in the state of its operation.

It is another object of the present invention to provide an abnormality detecting method for electric equipment which method can detect partial discharge generated during the operation of the electric equipment in the state of its operation, and further which method can specify partial discharge signals for each generation source.

It is a further object of the present invention to provide an abnormality detecting apparatus for a rotating electric machine which apparatus can widely and precisely detect partial discharge generated during the operation of the rotating electric machine in the state of its operation.

It is a further object of the present invention to provide an abnormality detecting apparatus for a rotating electric machine which apparatus can eliminate radio noises in the state of the operation of the rotating electric machine by separating partial discharge signals from the radio noises, and further which apparatus can detect the partial discharge signals having little discharged charges.

It is a further object of the present invention to provide an abnormality detecting apparatus for a rotating electric machine which apparatus can accurately determine the threshold value of separating partial discharge signals from radio noises in the state of including the errors caused by a little differences of the sensitivity of partial discharge sensors or the errors somewhat included in the measuring system of partial discharge, and which apparatus can precisely measure partial discharge signals.

It is a further object of the present invention to provide an abnormality detecting apparatus for a rotating electric machine which apparatus can clearly separate partial discharge signals from radio noises and detect the partial discharge signals having little discharged charges, which apparatus further can specify the generated positions of the partial discharge signals.

According to the first aspect of the present invention, for achieving the above-mentioned objects, there is provided an abnormality detecting method for electric equipment, in which method, the frequency spectrum of a signal detected by a discharge sensor provided in the electric equipment is measured, a resonance frequency is determined from the frequency spectrum on the basis of the electric equipment and its measuring circuit, and the generation source of the detected signal is specified from the value of the resonance frequency.

As stated above, in the abnormality detecting method for electric equipment according to the first aspect of the present invention, a resonance frequency is determined on the basis of electric equipment and its measuring circuit, and a partial discharge signal is detected in the neighborhood of the resonance frequency. Because a partial discharge signal contains a resonance frequency and the partial discharge signal is propagated without almost no reduction in this frequency band, the partial discharge signal can be detected in good sensitivity.

According to the second aspect of the present invention, there is provided an abnormality detecting method for electric equipment, in which method, the frequency spectrum of a signal detected by a partial discharge sensor for measuring the partial discharge of electric equipment is measured, a resonance frequency is determined from the frequency spectrum in accordance with the electric equipment and its measuring circuit, and a partial discharge signal is detected on the basis of the strength of the detected signal in the neighborhood of the resonance frequency and the strength of the detected signal at a predetermined frequency larger than the resonance frequency.

As stated above, in the abnormality detecting method for electric equipment according to the second aspect of the present invention, a resonance frequency is determined on the basis of electric equipment and its measuring circuit, and a partial discharge signal is detected on the basis of the signal strength in the neighborhood of the resonance frequency and the signal strength at a predetermined frequency larger than the resonance frequency. This is based on the fact that a partial discharge signal and a radio noise differ in the amount of the variation of the signal strength in the neighborhood of a resonance frequency and at a predetermined frequency larger than the resonance frequency.

According to the third aspect of the present invention, there is provided an abnormality detecting method for electric equipment, in which method, the frequency spectra of signals detected by plural partial discharge sensors for measuring the partial discharge of electric equipment are measured, a resonance frequency is determined from the frequency spectra on the basis of the electric equipment and its measuring circuit, the output signal strength of the plural partial discharge sensors in the neighborhood of the resonance frequency is compared, and the signals having different characteristic amounts which are included in the detected signals are separated.

As stated above, in the abnormality detecting method for electric equipment according to the third aspect of the present invention, partial discharge at plural parts of electric equipment is measured, a resonance frequency is determined on the basis of the electric equipment and its measuring circuit, and the signal strength of detected signals at plural places in the neighborhood of the resonance frequency are compared. Thereby, the signals having different characteristic amounts which are included in the detected signals are separated.

Partial discharge signals have different characteristic amounts in accordance with places where they are generated, and radio noises also have different characteristic amounts. Then, separating the signals having different characteristic amounts makes it possible to separate a partial discharge signal from a radio noise, and further makes it possible to specify the place where the partial discharge signal is generated.

According to the fourth aspect of the present invention, there is provided an abnormality detecting apparatus for a rotating electric machine, which apparatus comprises a partial discharge sensor being installed in a slot of a stator winding of a rotating electric machine for detecting partial discharge generated at the slot a narrow band filter circuit receiving an output signal from the partial discharge sensor and passing the same frequency component as a resonance frequency determined on the basis of the length of the stator core of the rotating electric machine, a partial discharge generation processing circuit executing a process in accordance with the generation of partial discharge, and a display unit displaying the result of the process.

As stated above, in the abnormality detecting apparatus for a rotating electric machine according to the fourth aspect of the present invention, a narrow band filter circuit passes the same frequency component as a resonance frequency determined on the basis of the length of the stator core of a rotating electric machine among the frequency components of a signal detected by a partial discharge sensor and accordingly, the narrow band filter circuit separates a partial discharge signal from a radio noise, both of which are generated during the operation of the rotating electric machine and at the same time, the filter circuit detects the partial discharge generated at a stator winding in a slot distant from the partial discharge sensor in good sensitivity.

According to the fifth aspect of the present invention, there is provided an abnormality detecting apparatus for a rotating electric machine, which apparatus comprises a partial discharge sensor being installed in a slot of a stator winding of a rotating electric machine for detecting partial discharge generated at the slot; a first narrow band filter circuit receiving an output signal of the partial discharge sensor and passing its frequency component being in the neighborhood of a resonance frequency determined on the basis of the length of the stator core of the rotating electric machine; a second narrow band filter circuit receiving the output signal of the partial discharge sensor and passing a frequency component larger than the resonance frequency; a noise distinguishing circuit distinguishing a partial discharge signal on the basis of two narrow band output signals from the first narrow band filter circuit and the second narrow band filter circuit, which noise distinguishing circuit has a peak hold circuit, a signal strength comparing circuit, a delay circuit and an elimination circuit; a partial discharge generation processing circuit executing a process in accordance with the generation of partial discharge; and a display unit displaying the result of the process.

As stated above, in the abnormality detecting apparatus for a rotating electric machine according to the fifth aspect of the present invention, a signal detected by a partial discharge sensor is divided into two parts, one part of which is passed through a first narrow band filter circuit passing the same frequency component as a resonance frequency determined on the basis of the length of the stator core of a rotating electric machine, the other part of which is passed through a second narrow band filter circuit passing a predetermined frequency component larger than the resonance frequency. By comparing the strength of the output signals from the two narrow band filter circuits, partial discharge and a radio noise, both of which are generated during the operation of the rotating electric machine, are separated.

According to the sixth aspect of the present invention, there is provided an abnormality detecting apparatus for a rotating electric machine, the noise distinguishing circuit of which comprises a processing circuit comparing the characteristic amounts of two narrow band output signals having passed two narrow band filter circuits respectively, the processing circuit obtaining a threshold value for separating a partial discharge signal from a radio noise on the basis of the histograms of the characteristic amounts, further the noise distinguishing circuit executing the distinction of the partial discharge signal by employing the value of the point of the intersection of the envelopes of the histograms as the threshold value in the case where the two histograms overlap, and by employing a value of the base of the envelope of the partial discharge signal as the threshold value in the case where the two histograms do not overlap.

As stated above, in the abnormality detecting apparatus for a rotating electric machine according to the sixth aspect of the present invention, the noise distinguishing circuit compares the characteristic amounts of two narrow band output signals having passed two narrow band filter circuits respectively, and obtains a threshold value for separating a partial discharge signal from a radio noise on the basis of the histograms of the characteristic amounts, further the noise distinguishing circuit executes the distinction of a detected signal by employing the value of the point of the intersection of the envelopes of the histograms as the threshold value in the case where the two histograms overlap, and by employing a value of the bottom of the envelope of the partial discharge signal as the threshold value in the case where the two histograms do not overlap.

According to the seventh aspect of the present invention, there is provided an abnormality detecting apparatus for a rotating electric machine, which apparatus comprises plural partial discharge sensors being installed in the slots of each phase of stator windings of a rotating electric machine for detecting the partial discharge generated at the slots; plural narrow band filter circuits receiving output signals from the partial discharge sensors and passing the same frequency components as a resonance frequency determined on the basis of the length of the stator core of the rotating electric machine; a noise distinguishing circuit distinguishing a partial discharge signal on the mutual strength differences among the narrow band output signals having passed the narrow band filter circuits, which noise distinguishing circuit has a peak hold circuit, a signal strength comparing circuit, a delay circuit and an elimination circuit; a partial discharge generation processing circuit executing a process in accordance with the generation of partial discharge; and a display unit displaying the result of the process.

As stated above, in the abnormality detecting apparatus for a rotating electric machine according to the seventh aspect of the present invention, partial discharge sensors are installed in each phase of stator windings, and each of the detected signals by the partial discharge sensors is passed through narrow band filter circuits having passing frequency bands being same as a resonance frequency determined on the basis of the length of the stator core of a rotating electric machine. Furthermore, the apparatus compares the mutual strength of the narrow band output signals of the partial discharge sensors at different phases of the stator windings with a noise distinguishing circuit, and separates a partial discharge signal from a radio noise or specifies the generation place of the partial discharge signal according to the result of the comparison.

The above and further objects and novel features of the present invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 3 is a block diagram showing a prior art abnormality detecting apparatus for a rotating electric machine, illustrating a generator partially broken away also for showing a partial discharge sensor installed in close vicinity to a stator winding;

FIG. 17 is a block diagram showing the abnormality detecting apparatus of the embodiment 6 of the present invention;

FIG. 25 is a block diagram showing the abnormality detecting apparatus for a rotating electric machine of the embodiment 11 of the present invention;

FIG. 32 is an explanatory table for illustrating the method of determining a threshold value of the noise distinguishing circuits of the embodiment 13 of the present invention.

DETAILED DESCRIPTION OF THE PREFERRED EMBODIMENTS

Preferred embodiments of the present invention will now be described in detail with referring to the accompanying drawings.

Embodiment 1

Figure 1:
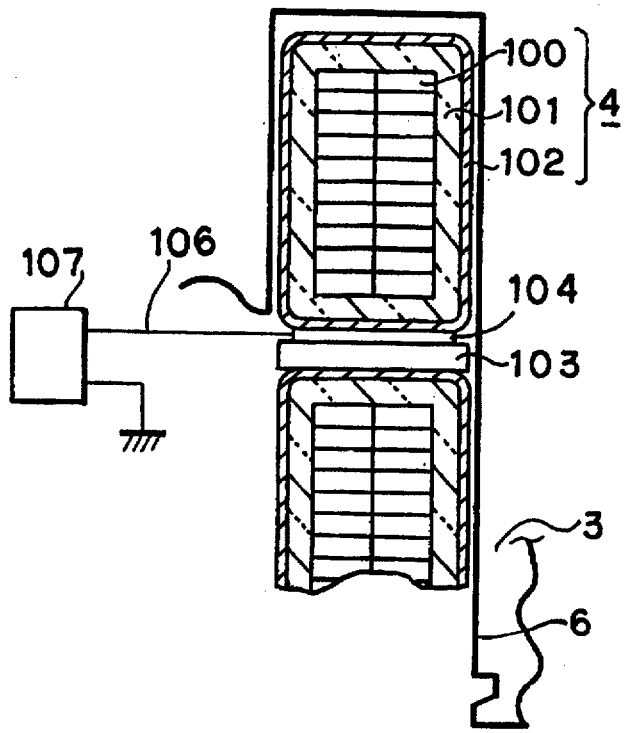
FIG. 1 is a sectional view showing the main part of a prior art corona detecting apparatus for a rotating electric machine.
Figure 2:
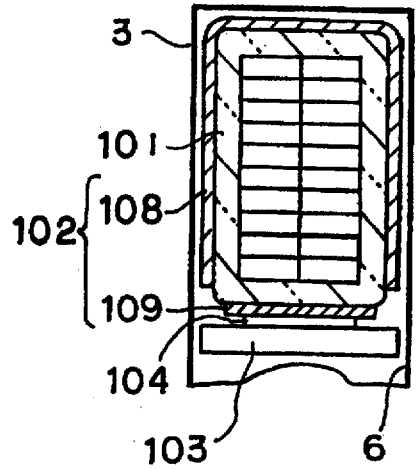
FIG. 2 is a sectional view showing the main part of another example of a prior art corona detecting apparatus.
Figure 4:
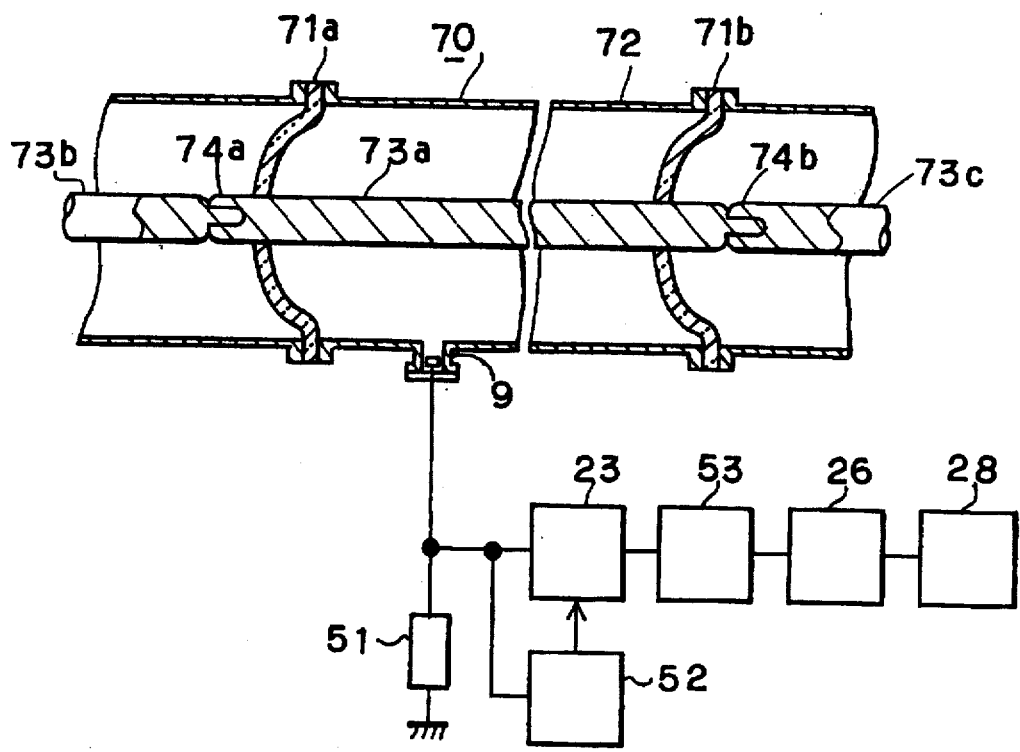
FIG. 4 is a block diagram showing an abnormality detecting apparatus using the abnormality detecting method for electric equipment of the embodiment 1 of the present invention.
Figure 5:
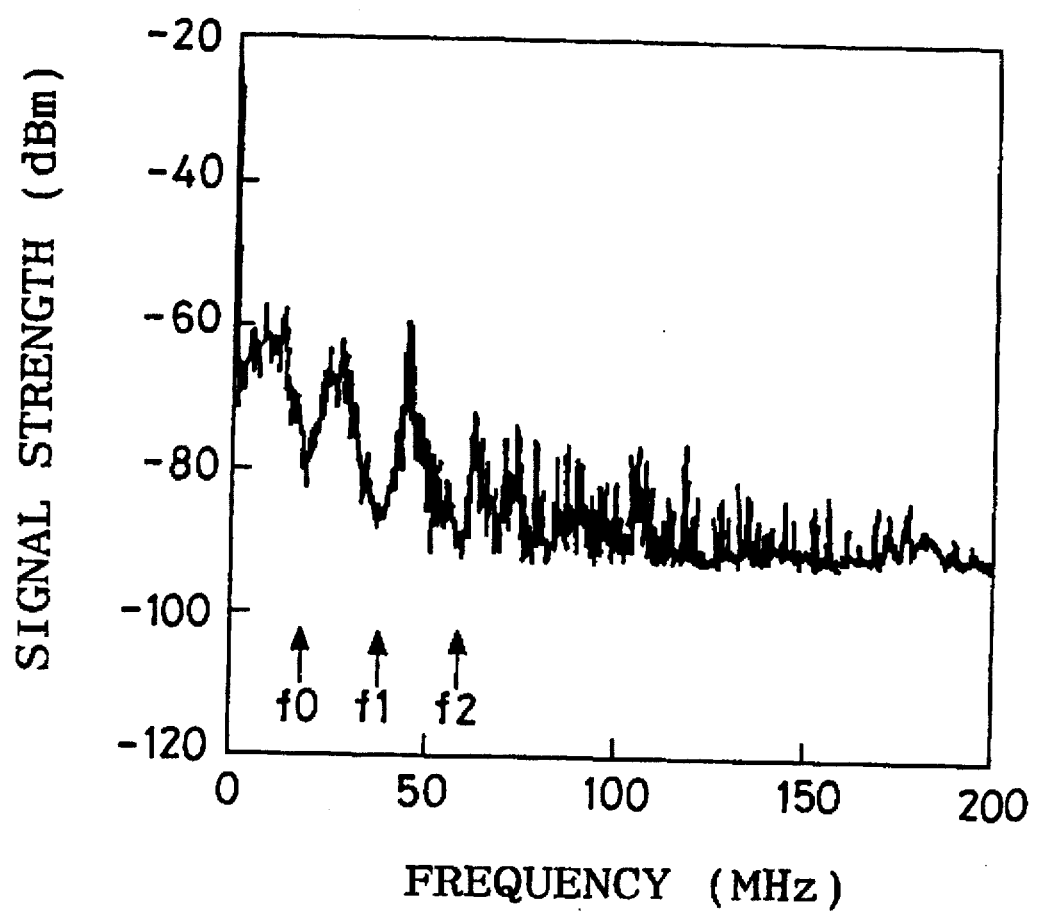
FIG. 5 is a characteristic diagram showing a partial discharge signal detected by the partial discharge sensor used in the embodiment 1 and depicted in signal strength (dBm) vs. frequencies (MHz)

FIG. 4 is a block diagram showing an abnormality detecting apparatus using the abnormality detecting method for electric equipment of the embodiment 1, illustrating a partial section of the electric equipment also. FIG. 5 is a characteristic diagram showing a partial discharge signal detected by the partial discharge sensor used in the abnormality detecting apparatus, the axis of abscissa of which figure denotes frequencies (MHz) and the axis of ordinate of which figure denotes signal strength (dBm). In FIG. 4, reference numeral 70 designates electric equipment such as a GIS. In the GIS 70, conductors 73a, 73b and 73c are disposed at the central part of a housing 72 made of a metal, being insulated by insulating spacers 71a and 71b in order to hold a high voltage imposed state. The GIS 70 is constructed by connecting a breaker, a disconnector, a current transformer, and so forth (all of them are not shown) to the constructions shown in FIG. 4, which constructions are used as units of the connection. Consequently, there inevitably are connection parts 74a and 74b in the conductors of the GIS 70.

The housing 72 is provided with a partial discharge sensor 9, a detecting impedance element 51, a spectrum analyzer 52, a narrow band filter circuit 23, a partial discharge measuring circuit 53, a partial discharge generation processing circuit 26 and a display unit 28 in order to detect partial discharge when an abnormality happens in the GIS 70.

Next, the operation of this abnormality detecting apparatus will be described with referring to FIG. 4 and FIG. 5.

A high voltage is imposed on the conductors 73a, 73b and 73c during the GIS 70 is operated. When an abnormality happens in the GIS 70, partial discharge is generated to be propagated through the conductor 73a.

As for the abnormality in the GIS 70, for example, there can be considered a case where extraneous substances such as metal particles remained in the housing 72 or the other dust move in the GIS 70 by the potential of the electric field in the housing 72 to form unbalanced places in the electric field in the housing 72. Also, there can be considered the case where a void is produced by the occurrences of cracks or exfoliation in the insulation spacers 71a and 71b, or by voltage deterioration. In these cases, the turbulence of the electric field generates partial discharge at the places where the turbulence happens, then the abnormality of the GIS 70 can be detected by detecting the partial discharge.

The generation of the partial discharge propagates a rapid partial discharge signal through the conductor 73a and the housing 72. The speed of the propagation is almost same as the speed of light. Because the conductor 73a has connection parts 74a and 74b on its both ends and the impedance of it changes at both the ends, a part of the partial discharge signal is propagated to the direction of becoming more distant from the generation source of the partial discharge with repeating the reflections, going and returning between the connection parts 74a and 74b. Furthermore, both the ends of the housing 72 are provided with the insulation spacers 71a and 71b, and the change of impedance is occurred at these parts also. Consequently, the partial discharge signal being propagated through the housing 72 also is propagated with repeating the reflections, going and returning between both the ends of the housing 72.

Thus, a partial discharge signal generated at a certain place in the GIS 70 is detected as a signal including a resonance frequency related to the length of the conductor 73a and the length of the housing 72 at the place where the discharge signal was generated. Besides, because the measuring circuits also are distributed constant circuits having L-, C- and R- components, they often have resonance frequencies as shown in FIG. 5. FIG. 5 illustrates a frequency characteristic drawn by dotting the data of a partial discharge signal including these resonance frequencies, which data were actually measured by the spectrum analyzer 52 shown in FIG. 4. In FIG. 5, reference mark $f_0$ designates the first order resonance frequency, reference mark $f_1$ designates the second order resonance frequency, reference mark $f_3$ designates the third order resonance frequency. The resonance frequencies are related to the length of the conductor 73a in this case. The values of resonance frequencies are consequently changed in accordance with the places where the partial discharge signal is generated.

This embodiment determines the resonance frequencies from the signals detected by the partial discharge sensor 9, and specifies the generation source of a partial discharge signal from the values of the resonance frequencies.

Next, the detection of the partial discharge signal having these resonance frequencies will be described.

By putting an imitation signal of partial discharge into a high voltage bus of the GIS 70 with, for example, a pulse generator before the operation of the GIS 70, the partial discharge sensor 9 detects the partial discharge signal having the characteristic shown in FIG. 5. This partial discharge signal is detected by the detecting impedance element 51, and is transmitted to the spectrum analyzer 52 at first. The spectrum analyzer 52 analyzes the frequency spectrum of the partial discharge signal to determine the resonance frequency. The result of its determination is transmitted to the narrow band filter circuit 23 to adjust the signal passing band of the narrow band filter circuit 23 in the neighborhood of the resonance frequency.

The signals detected by the partial discharge sensor 9 during the operation of the GIS 70 are detected by the detecting impedance element 51 to be transmitted to the narrow band filter circuit 23 in the same way mentioned above. Because the signal passing band of the narrow band filter circuit 23 is selected in the neighborhood of the resonance frequency, the signals having the frequencies in the neighborhood of the resonance frequency pass the narrow band filter circuit 23 to be transmitted to the partial discharge measuring circuit. 53. Moreover, the signals are detected and amplified to be detected as partial discharge signals by the partial discharge measuring circuit 53, and their pulse heights are analyzed at the same time to be transmitted to the partial discharge generation processing circuit 26.

The partial discharge generation processing circuit 26 measures the distributions of the frequencies of the generation of discharge and the phase characteristics of the generated discharge. The results processed by the processing circuit 26 are transmitted to the display unit 28 such as a CRT, and are recorded at the same time. Also, the processing circuit 26 records the changes with the passage of time of these various characteristics, and judges the degrees of insulation abnormalities by comparing the processed results with the registered past statistical data and abnormality judging data, and further transmits the judged data to the display unit 28. The display unit 28 displays those various characteristics, and displays an abnormality when it is judged to have happened, and further displays an alarm in that case.

As described above, a propagated signal of partial discharge generated in the GIS 70 has resonance frequencies corresponding to the length changing the impedance of the conductors and the housing, and has resonance frequencies corresponding to the measuring circuits, and consequently, the generation source of detected discharge can be detected by having an eye to these resonance frequencies.

The description was done about a GIS in this embodiment, but the present invention can be applied to other electric equipment, then the frequency spectrum of a signal detected by a partial discharge sensor for measuring the partial discharge of the electric equipment is measured, and resonance frequencies are determined from the frequency spectrum on the basis of the electric equipment and its measuring circuits. By specifying the generation source of the detected signal from the values of this frequency spectrum, the generation source of partial discharge can be detected in the operation state of the electric equipment.

Embodiment 2

Figure 6:
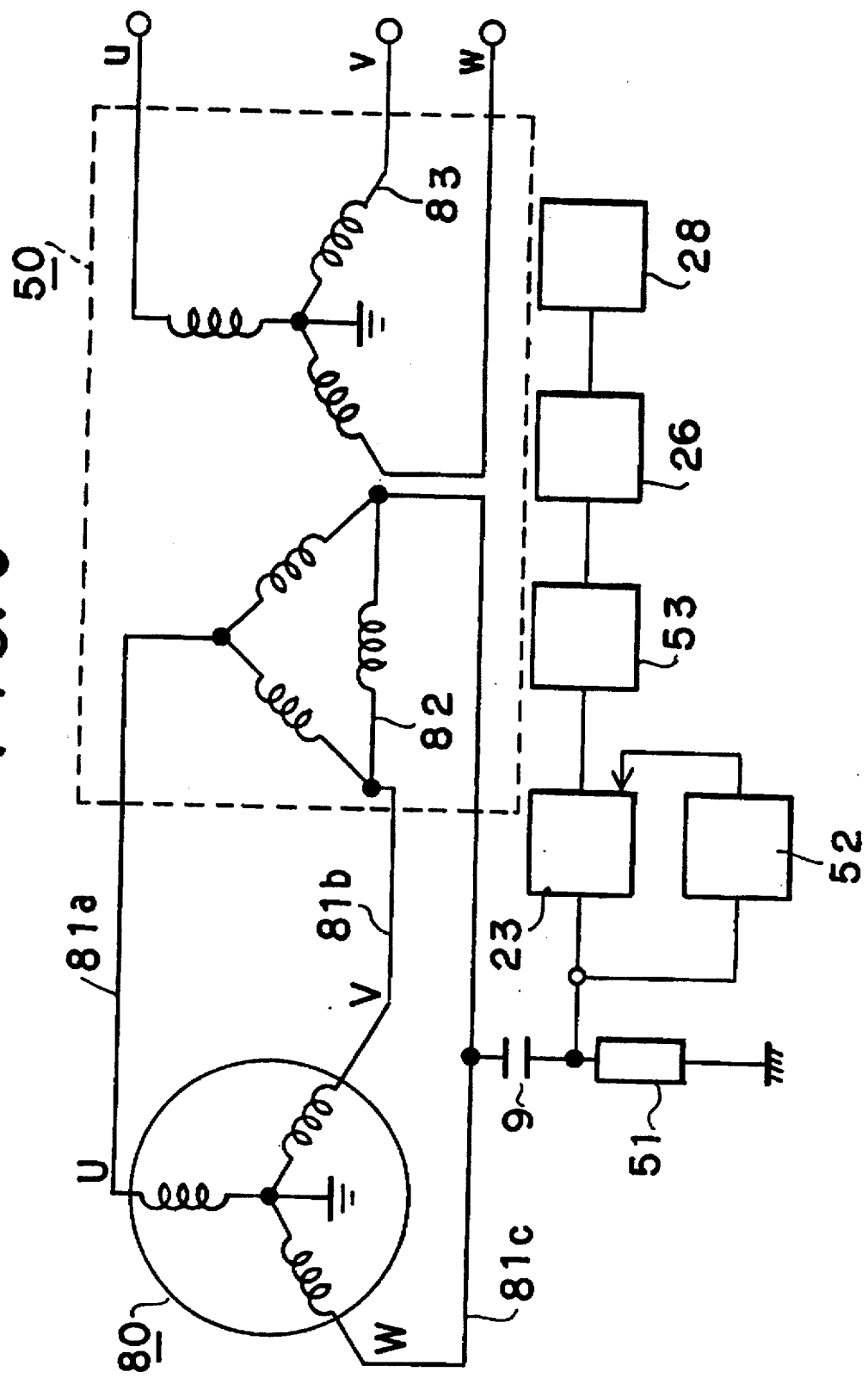
FIG. 6 is a block diagram showing an abnormality detecting apparatus using the abnormality detecting method for electric equipment of the embodiment 2 of the present invention.
Figure 7:
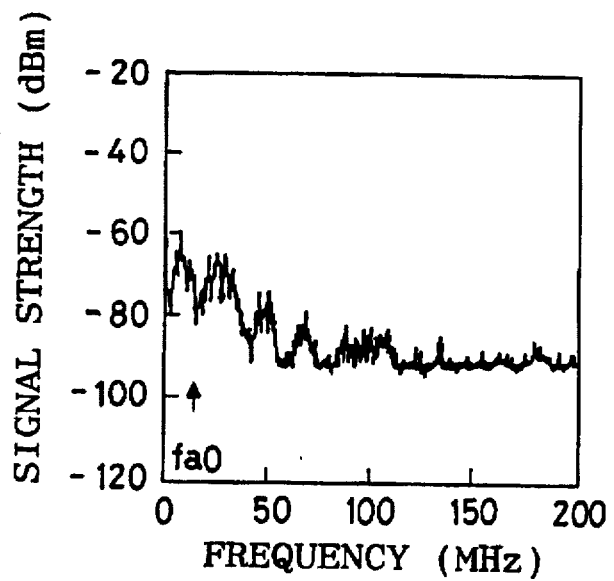
FIG. 7(a), FIG. 7(b) and FIG. 7(c) are characteristic diagrams showing partial discharge signals detected by the partial discharge sensor used in the embodiment 2 and depicted in signal strength (dBm) vs. frequencies (MHz)
Figure 7:
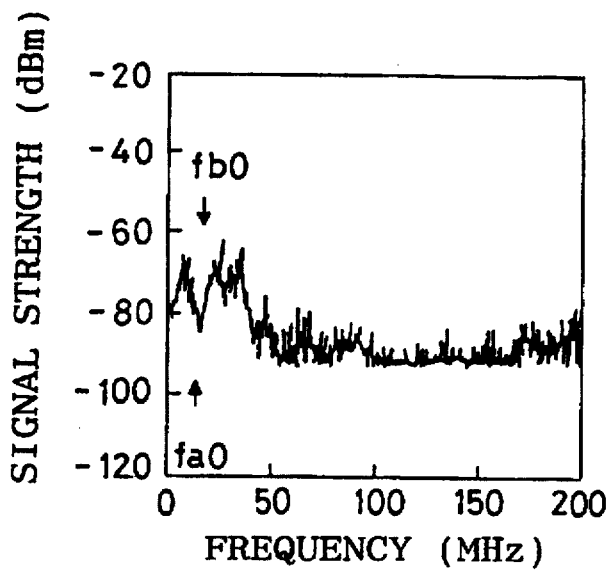
Figure 7:
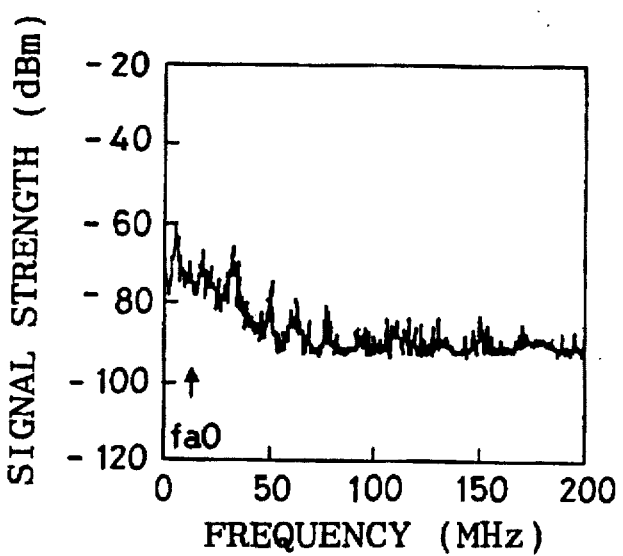

Now, the embodiment 2 of the present invention will be described with referring to drawings. FIG. 6 is a block diagram showing an abnormality detecting apparatus using the abnormality detecting method for electric equipment of the embodiment 2, illustrating the construction of the electric equipment together. FIG. 7(a), FIG. 7(b) and FIG. 7(c) are characteristic diagrams of partial discharge signals detected by a partial discharge sensor used in the abnormality detecting apparatus, the axes of abscissas of the figures denote frequencies (MHz) and the axes of ordinates of the figures denote signal strength (dBm).

The electric equipment in this embodiment is, for example, a power generation plant. In FIG. 6, reference numeral 80 designates a generator, and reference numeral 50 designates a transformer. The electricity generated by the generator 80 is supplied to the primary windings 82 of the transformer 50 through the high voltage buses 81a, 81b and 81c, and is stepped up at the secondary windings 83 to be supplied to the transmission system. The high voltage buses 81a, 81b and 81c are operated at high voltages from 10 kV to 25 kV. In this embodiment, a partial discharge sensor 9 is provided at a place of the high voltage buses 81a, 81b and 81c to detect the abnormalities of high voltage buses 81a–81c, the generator 80 and the transformer 50. FIG. 6 illustrates a construction that the partial discharge sensor 9 is provided at, for example, the high voltage bus 81c alone.

High voltages are imposed on the high voltage buses 81a, 81b and 81c. Accordingly, if deterioration is caused in an insulator due to voltage deterioration, partial discharge is generated, and the signal of the partial discharge is propagated through the high voltage bus 81c in a high speed. The signal becomes a partial discharge signal having resonance frequencies related to the length of the high voltage bus 81c similarly in the embodiment 1. The characteristics of this signal detected by the partial discharge sensor 9 are shown in FIG. 7(a)–FIG. 7(c). FIG. 7(a) illustrates the frequency characteristic of a partial discharge signal generated at the high voltage bus 81c, FIG. 7(b) illustrates the frequency characteristic of a partial discharge signal generated at the generator 80, and FIG. 7(c) illustrates the frequency characteristic of a partial discharge signal generated at the transformer 50. In FIG. 7(a)–FIG. 7(c), reference mark $f_{ao}$ designates the resonance frequency of the high voltage bus 81c, and reference mark $f_{bo}$ in FIG. 7(b) designates the resonance frequency of a stator winding of the generator 80 in which partial discharge is generated. As shown in FIGS. 7(a)–7(c), the frequency characteristics are different finely in accordance with the places where partial discharge is generated. Then, the generation source of partial discharge can be specified in any case by executing the signal process in the same way as described about the embodiment 1.

That is to say, the frequency spectra of signals detected by the partial discharge sensor 9 for measuring the partial discharge of the electric equipment are measured by the spectrum analyzer 52, and at least one resonance frequency is determined from the frequency spectra on the basis of the electric equipment and its measuring circuits so that each frequency characteristic is grasped in advance. Next, the partial discharge measurement processing circuit 53 detects the partial discharge signal from the detected signals having frequency components in the neighborhood of the resonance frequency and having passed the narrow band filter circuit 23, as for the signals detected during the operation of the electric equipment. Thus, the partial discharge generated during the operation of the electric equipment can be detected in the state of the operation of the electric equipment, and further from the characteristic amount of the partial discharge, the place where the partial discharge was generated can be specified.

Embodiment 3

Figure 8A:
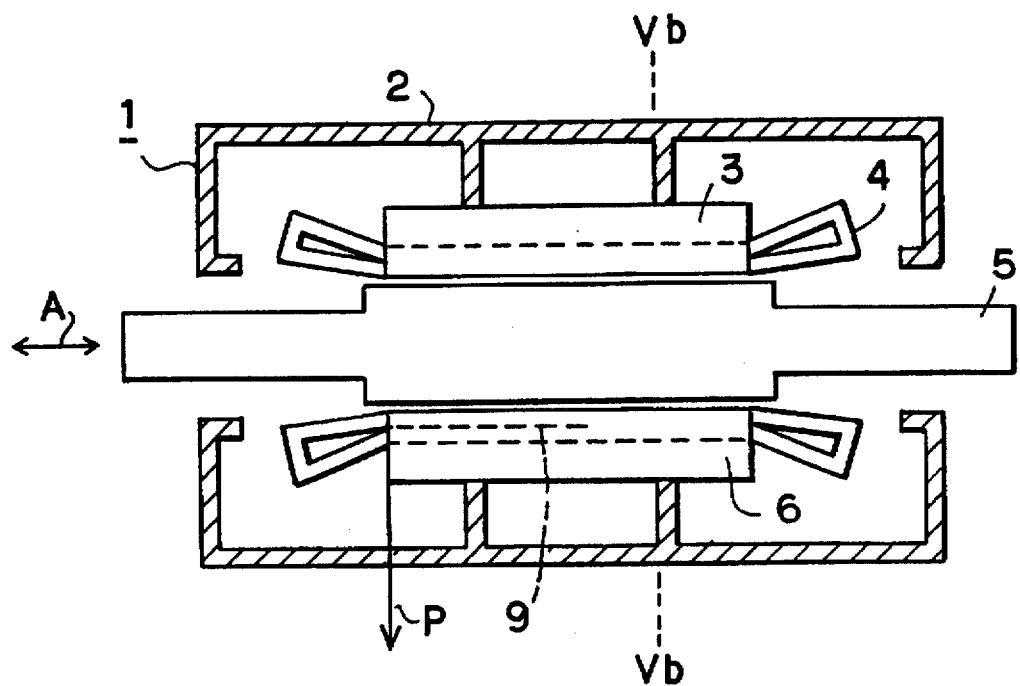
FIG. 8(a) and FIG. 8(b) are sectional views showing the construction of a rotating electric machine to which the embodiment 3 of the present invention is applied.
Figure 8B:
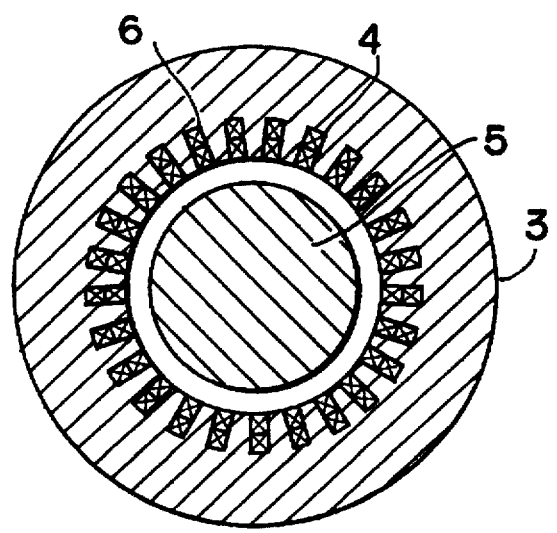
Figure 9:
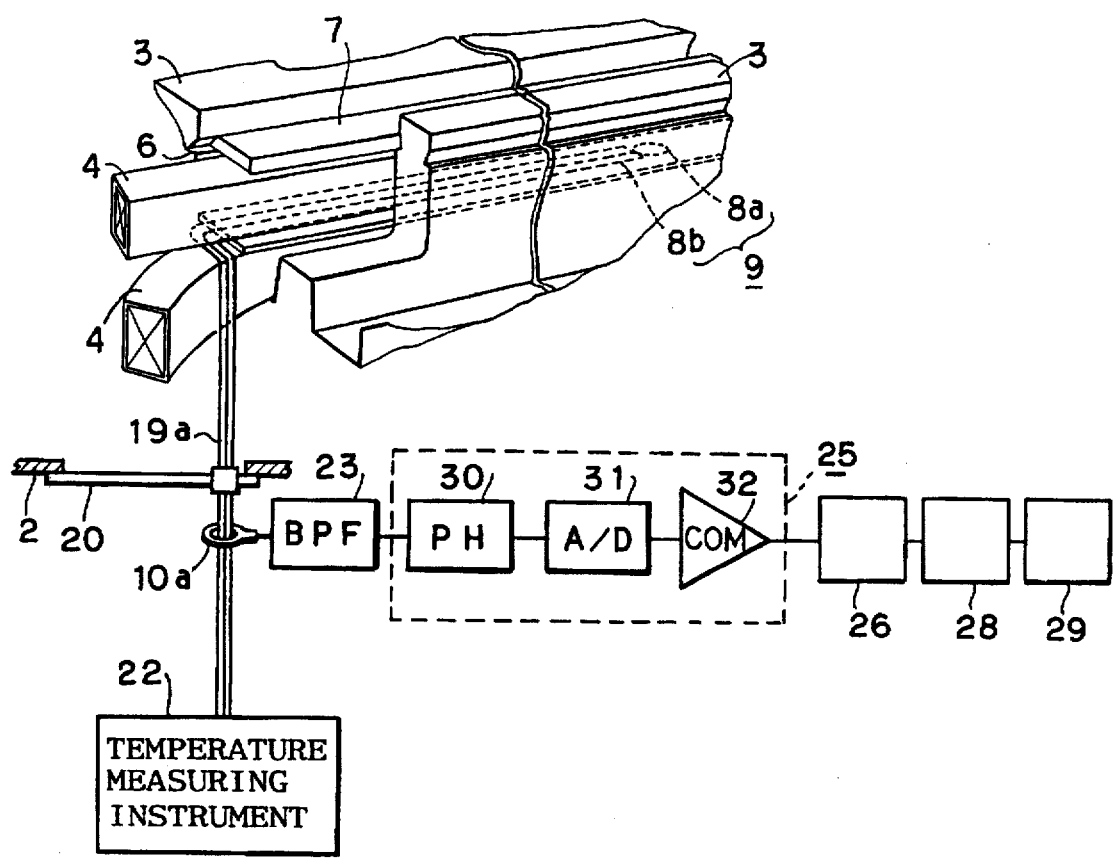
FIG. 9 is a block diagram showing the abnormality detecting apparatus for a rotating machine of the embodiment 3, illustrating the rotating electric machine partially broken away also.
Figure 10:
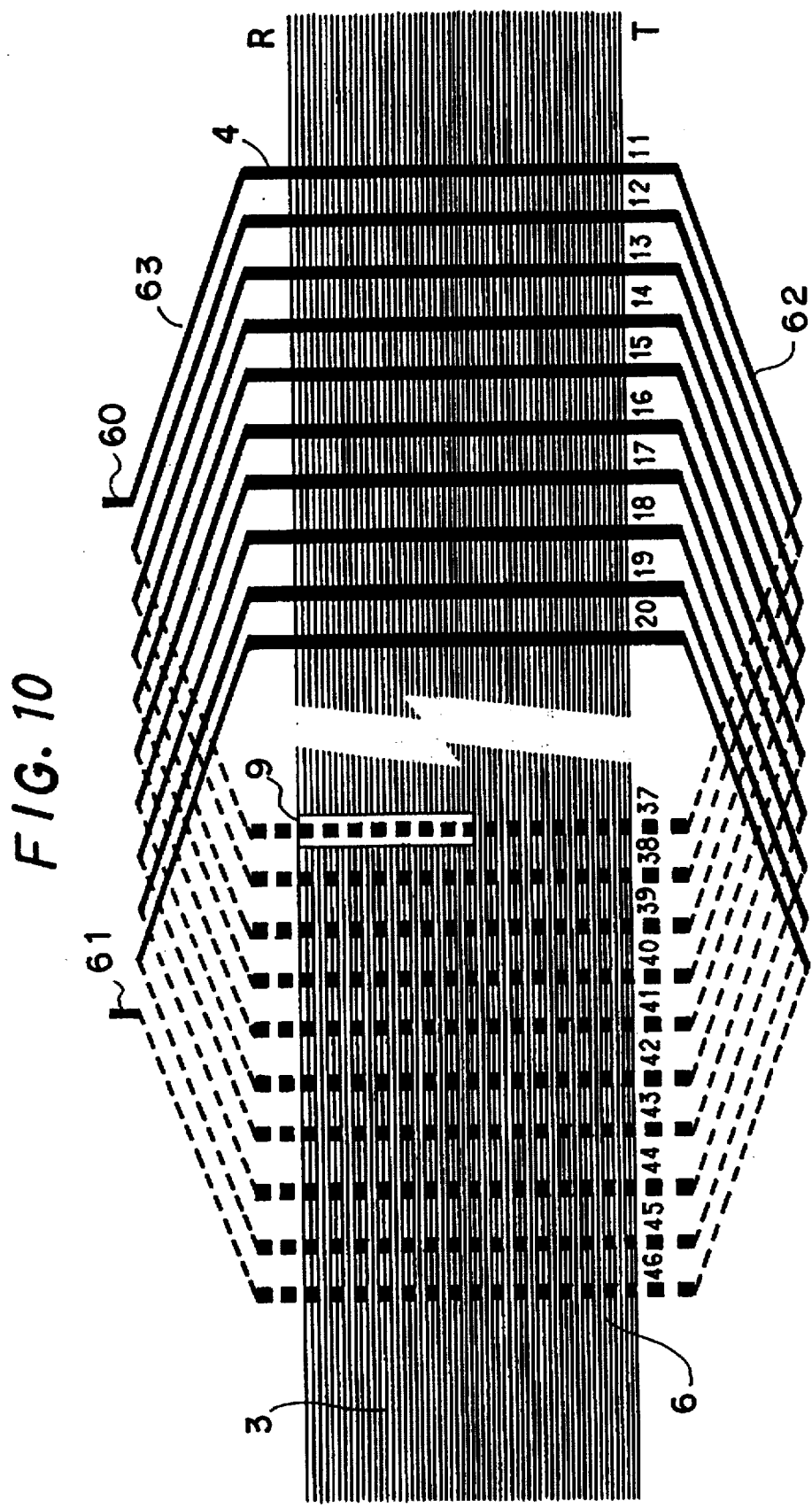
FIG. 10 is a developed plan view showing a wound state of a stator winding of the rotating electric machine to which the embodiment 3 is applied, which stator winding is inserted into the stator core.
Figure 11:
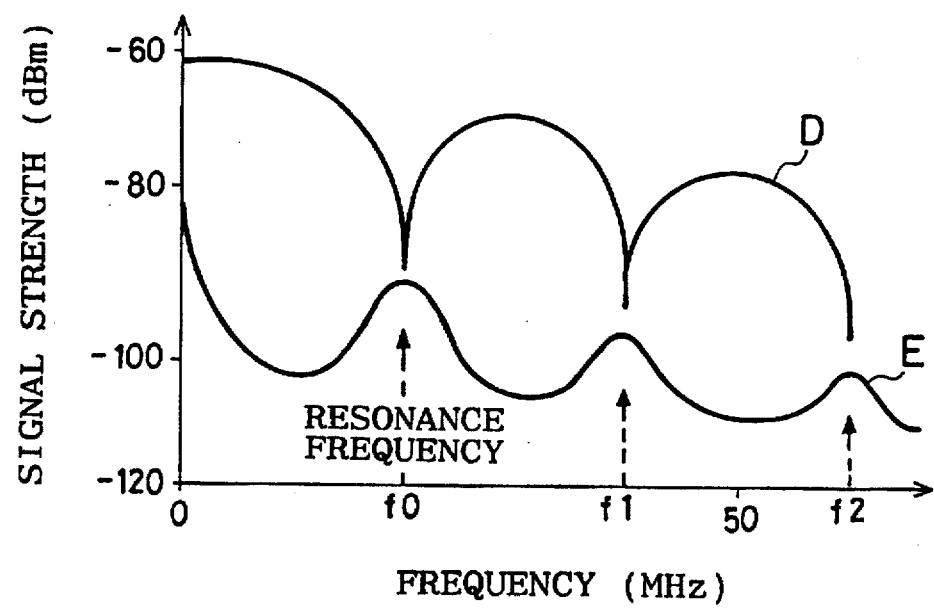
FIG. 11 is a characteristic diagram showing a frequency characteristic of a partial discharge signal detected by the partial discharge sensor of the rotating electric machine to which the embodiment 3 is applied, the axis of abscissa of which denotes frequencies (MHz) and the axis of ordinate of which denotes detected strength (dBm)
Figure 12:
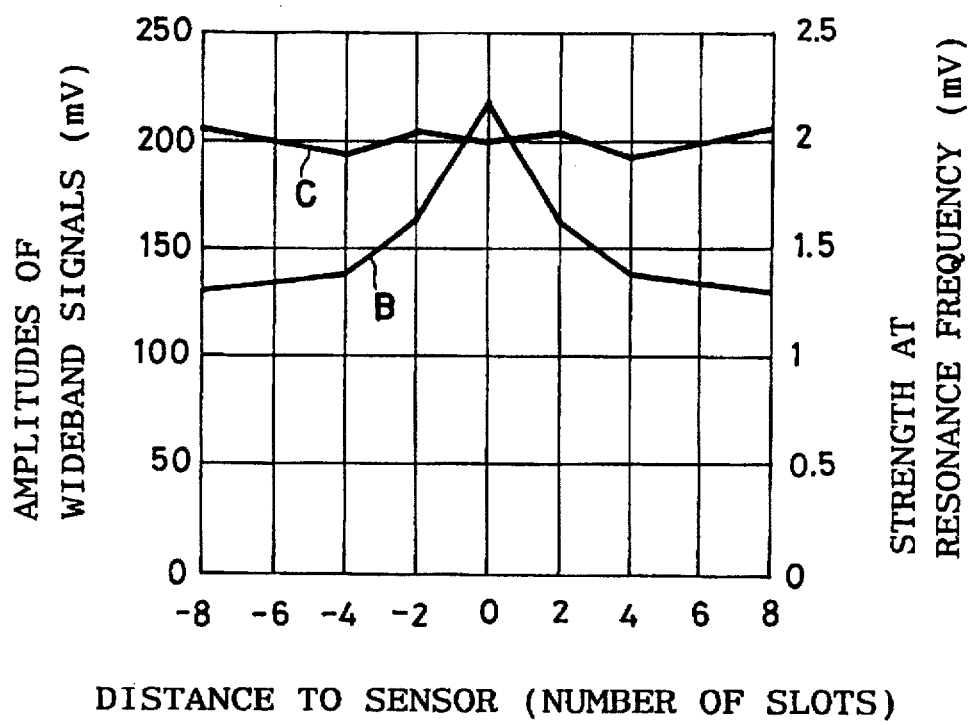
FIG. 12 is a characteristic diagram showing the characteristics of partial discharge signals when the signals are propagated through stator windings of the rotating electric machine to which the embodiment 3 is applied, the axis of abscissa of which denotes the distance to the sensor (the number of slots) and the axes of ordinate of which denote the amplitudes of wide band signals (mV) and the signal strength at a resonance frequency (mV)

Hereinafter, the embodiment 3 of the present invention will be described with referring to drawings. FIG. 8(a) and FIG. 8(b) are sectional views showing the construction of a rotating electric machine to which the embodiment 3 is applied. FIG. 8(a) is a vertical sectional view, and FIG. 8(b) is a sectional view showing the rotating electric machine cut along the line Vb—Vb of FIG. 8(a) except for the stator frame of the machine. FIG. 9 is a block diagram showing the abnormality detecting apparatus of the embodiment 3, illustrating the rotating electric machine partially broken away also for indicating the position of a partial discharge sensor disposed in close vicinity to the stator winding. FIG. 10 is a developed plan view showing a wound state of a stator winding inserted into a stator core. FIG. 11 is a characteristic diagram showing a frequency characteristic of a partial discharge signal detected by the partial discharge sensor, the axis of abscissa of FIG. 11 denotes frequencies (MHz) and the axis of ordinate of FIG. 11 denotes detected signal strength (dBm). And, FIG. 12 is a characteristic diagram showing the characteristics of partial discharge signals when the signals are propagated through stator windings, the axis of abscissa of FIG. 12 denotes the distance to the partial discharge sensor (the number of slots) and the axes of ordinate of FIG. 12 denote the amplitudes of wide band signals (mV) and the signal strength at a resonance frequency (mV).

Referring to FIG. 8(a), FIG. 8(b) and FIG. 9, the rotating electric machine 1 is composed of a rotor 5 and a stator comprising a stator frame 2, a stator core 3, stator windings 4, and so forth. In FIG. 8(a), an arrow mark "A" designates the direction of the axis of the rotation shaft. The stator core 3 is fixed in the stator frame 2, and predetermined number of slots 6 are formed on the inside circumference surface of the stator core 3 at equal intervals in the circumferential direction in a state of being elongated to the direction of the axis A. In each slot 6, two stator windings 4, upper one and lower one, are housed and fixed by a wedge 7 as shown in FIG. 9. A discharge sensor 9, which is equipped in a slot 6 for the stator windings 4 of the rotating electric machine 1 to detect the partial discharge in the slot 6, is composed of, for example, a temperature detecting element 8a made of a platinum resistor and lead wires 8b of the temperature detecting element 8a, and further the discharge sensor 9 is constructed by being enclosed with glass-epoxy laminate plates around them.

As shown in FIG. 10, the stator windings 4 are inserted into the slots 6 of the stator core 3, and connected from the line side end 60 to the neutral point end 61 of the stator windings 4 in hexagonal shapes. Twelve turns through twenty turns of the hexagonal connections compose one phase. The numbers in the drawing designates the numbers of the slots.

The partial discharge sensor 9 is inserted between two stator windings 4, an upper coil and a lower coil, in a slot 6 near to the line side end 60 of the stator windings 4. As shown in FIG. 9, the lead wires 19a from the partial discharge sensor 9 are wired-from the end portion of the stator core 3 along the inside of the stator frame 2 to be lead out to the outside of the stator frame 2 through a terminal of a terminal box 20, and are connected to a temperature measuring instrument 22 in the central control room.

A high frequency current transformer is provided around the lead wires 19a at the exit of the terminal box 20 as a detector 10a for measuring partial discharge. The signal outputted from the detector 10a passes a narrow band filter circuit 23, for example a band pass filter (BPF), to be transmitted to a peak hold circuit (PH) 30. And the signal is transformed into a digital signal by an analogue / digital converter (hereinafter referred to as A / D converter) 31 to be transmitted to a signal strength comparing circuit (COM) 32. Furthermore, this apparatus is constructed to transmit the signal to a partial discharge generation processing circuit 26, a display unit 28 and an abnormality displaying apparatus 29. The narrow band filter 23 in this embodiment is constructed to receive the output signals from the partial discharge sensor 9, and its passing frequency band is set to be a resonance frequency determined on the basis of the length of the stator core 3 of the rotating electric machine 1. Besides, the peak hold circuit (PH) 30, the A / D converter 31 and the signal strength comparing circuit 32 compose a noise distinguishing circuit 25 for discriminating the output signals of the narrow band filter circuit 23 as partial discharge signals, and the partial discharge generation processing circuit 26 executes its process when the noise distinguishing circuit 25 distinguishes the generation of partial discharge.

Next, the operation of the apparatus will be described. In this embodiment, for example, a generator will be described as the rotating electric machine.

While a generator is operated, a high voltage is generated in the stator windings 4. When an abnormality occurs due to the insulation deterioration of the stator windings 4 and so forth, partial discharge is generated in the stator windings 4 so that high frequency current flows. The high frequency current caused by the discharge is propagated to the partial discharge sensor 9 also, which sensor 9 is electrostatically connected to the upper and the lower stator windings 4, and the high frequency current flows into the lead wires 19a of the partial discharge sensor 9. This high frequency current is detected by the detector 10a using a high frequency current transformer. The detected partial discharge signal is inputted into the narrow band filter circuit 23. The partial discharge is a high speed phenomenon in the order of nano-seconds, then only the high frequency components of the partial discharge is outputted to the peak hold circuit 30 after the partial discharge signal is filtered by the narrow band filter circuit 23.

The partial discharge sensor 9 detects not only the partial discharge signals but also many radio noises generated in the generator during its operation and radio noises generated at the outside of the generator. In order to eliminate these radio noises for detecting partial discharge generated in the wide area of the stator windings 4 in high accuracy, the passing frequency band of the narrow band filter circuit 23 is selected to be the resonance frequency determined on the basis of the length of the stator core 3. This resonance frequency $f_0$ is determined in conformity with, for example, the next equation 1.

$$f_0 = nc/2l\sqrt{\epsilon} \qquad (1)$$

In this equation, mark "n" designates a natural number, mark "c" designates the velocity of light, mark "l" designates the length of the stator windings 4 on which low resistance paint is coated, and mark "$\epsilon$" designates the relative permittivity of the main insulator of the stator windings 4, the value of which ordinarily is about 4 or 5. And, the length "l" of the stator windings 4 on which low resistance paint is coated is longer than the length of the stator core 3 by about 300 mm further. Since the length of the stator core 3 is designed in accordance with the rating of a generator, the length "l" differs from equipment to equipment, and accordingly the resonance frequency $f_0$ also differs from equipment to equipment.

Now, the reason why a resonance frequency is used as the passing frequency band of the narrow band filter 23 will be described. Referring to FIG. 10, in the case where partial discharge is generated in the stator winding 4 in the slot 6 of the number 11, which is formed in close vicinity to the line side end 60 of the stator windings 4, the discharge signal is propagated in the conductors of the stator windings 4. Supposing that mark T designates the side of the turbine and mark R designates the side of the exciter, and further supposing that reference numeral 62 designates the coil end portion of the turbine side and reference numeral 63 designates the coil end portion of the exciter side, the propagation path of the partial discharge signal is as follows: that the partial discharge signal gotten out from the turbine side of the slot No. 11 enters the slot No. 37 through the coil end portion 62 of the turbine side, and the signal is propagated inside the slot 6 to pass the coil end portion 63 of the exciter side, and further that the partial discharge signal enters the slot No. 12 to be propagated in the stator windings 4 in the slot 6 and is propagated in the coil end portion 62 of the turbine side toward the slot 6 of No. 38.

The partial discharge signal is thus propagated in the conductors of the stator windings 4 in turn, and it is known that the partial discharge signal is attenuated in proportion as the signal is propagated to a distance, since the signal is a high frequency signal. This attenuation is remarkable in the case where the signal is a wide band signal. FIG. 12 illustrates the results of the measurement of the degree of the attenuation about a generator having a stator core the length of which is about 4 meter. A wide band signal, shown as the character B in FIG. 12, is attenuated to 72% of the amplitude of the position where the sensor 9 is located at the distance of 2 slots from the sensor 9, and is attenuated to 62% of the amplitude of the position where the sensor 9 is located at the distance of 4 slots from the sensor 9.

But, when a partial discharge signal, being propagated in the stator windings 4, was detected by the partial discharge sensor 9 and the frequency of it was analyzed, it is found that there was a frequency band of a partial discharge signal passing inside the slot 6 and being hardly attenuated to be propagated. The results are shown in FIG. 11, and the propagation characteristic of the signal having the frequency being in the frequency band is shown in FIG. 12 by the character C. FIG. 11 illustrates a partial discharge signal D generated in a slot 6 where the partial discharge sensor 9 is not installed and a partial discharge signal E generated in the slot 6 where the partial discharge sensor 9 is installed. The partial discharge signal D generated in the slot 6 where the partial discharge sensor 9 is installed has strong signal strength, and falls of the signal strength can be observed at the frequency bands of $f_0$, $f_1$ and $f_2$. Contrarily to the signal D, there can be found the increments of the strength of the partial discharge signal E generated in the slot 6 where the partial discharge sensor 9 is not installed (the slot 6 is distant from the installed position of the partial discharge sensor 9) at the frequency bands of $f_0$, $f_1$, and $f_2$. This mark $f_0$ designates a resonance frequency determined in accordance with the length of the stator core 3, mark $f_1$ designates the first harmonic of the resonance frequency $f_0$, and mark $f_2$ designates the second harmonic of the resonance frequency $f_0$.

Then, the signal propagation characteristic C at the resonance frequency $f_0$ shown in FIG. 12 was obtained by the investigation upon the propagation of the signal having the resonance frequency $f_0$. That is to say, it was ascertained that partial discharge signal can be propagated with almost no attenuation to a distance in the frequency band of the resonance frequency $f_0$, although the partial discharge signal being a wide band signal is attenuated in proportion as it is propagated. It is also ascertained that the frequency characteristic having a resonance frequency is peculiar to the discharge phenomena, and that the radio noises from the outside show different frequency characteristics. Furthermore, it is ascertained that the signal strength of the partial discharge signal D, shown in FIG. 11, generated in the slot 6 where the discharge sensor 9 is installed is attenuated at the resonance frequency $f_0$ and its harmonic frequencies $f_1$ and $f_2$, however the partial discharge signal D has enough signal strength to be detected in spite of the attenuation, since the detection place is near to the generation place of the signal.

As described above, as for the propagation characteristics of partial discharge signals, partial discharge signals having wide frequency bands are attenuated in proportion as they are propagated, but the partial discharge signal having a frequency of the resonance frequency $f_0$ is propagated to a distance with almost no attenuation. Because the passing frequency band of the narrow band filter circuit 23 is selected to be the resonance frequency $f_0$, the partial discharge signal generated in the stator winding 4 in the slot 6 in which the partial discharge sensor 9 is installed and the partial discharge signal generated in the stator winding 4 in the slot 6 far away from the slot 6 in which the partial discharge sensor 9 is installed can be detected as a strong signal respectively, and radio noises from the outside can be removed by being attenuated. Consequently, the partial discharge signals can be detected, and further partial discharge signals generated in the wide areas of the stator windings 4 can be detected with one partial discharge sensor.

After filtering to remove radio noises from the outside with the narrow band filter 23 and filtering not only the partial discharge signal generated in the slot 6 where the partial discharge sensor 9 is installed but also the partial discharge signals generated in the wide areas of the slots 6, the peak values of the partial discharge signals are detected by the peak hold circuit 30 to be transmitted to the A / D converter 31. The A / D converter 31 converts the analogue output signals of the peak hold circuit 30 to digital signals to transmit them to the signal strength comparing circuit 32. The signal strength comparing circuit 32 compares the output signals of the A / D converter with a reference signal and passes only the necessary signals, and further the signal strength comparing circuit 32 reads the inputted signal levels to transmit to the partial discharge generation processing circuit 26.

The partial discharge generation processing circuit 26 measures the distributions of the frequencies of the generation of discharge and the phase characteristics of generated discharge. The results processed by the processing circuit 26 are transmitted to the display unit 28 and are recorded at the same time. Also, the processing circuit 26 records the changes with the passage of time of these various characteristics, and judges the degrees of insulation abnormalities by comparing the processed results with the registered past statistical data and abnormality judging data to transmit the judged data to the display unit 28. The display unit 28 displays those various characteristics. And further, the partial discharge generation processing circuit 26 transmits an abnormality signal to the abnormality displaying apparatus 29 when the abnormality is judged to have happened, and the abnormality displaying apparatus 29 displays the happening of the abnormality and gives an alarm in that case.

In this embodiment, thus, the partial discharge generated during the operation of a rotating electric machine can be detected accurately in the state of the operation of the rotating electric machine by measuring the narrow band signal having a resonance frequency determined on the basis of the length of the stator core of a generator. Furthermore, this embodiment can eliminate radio noises from the outside and detect partial discharge signals generated in the wide areas of the stator windings, the accuracy of the detection of abnormalities is improved consequently.

In the embodiment described above, the description thereof was given about a generator, it is of course that the present invention is not limited to the generator, and that the invention is applicable to other rotating electric machines and the abnormality detection of electric equipment also.

Embodiment 4

Hereinafter, the embodiment of the present invention will be described with referring to drawings. In the embodiment 3, the description thereof was given to the example that the passing frequency band of the narrow band filter circuit 23 is selected to be the resonance frequency $f_0$ determined on the basis of the length of the stator core 3 of a generator. However, the passing frequency band of the narrow band filter circuit 23 is not necessarily limited to this.

Figure 13:
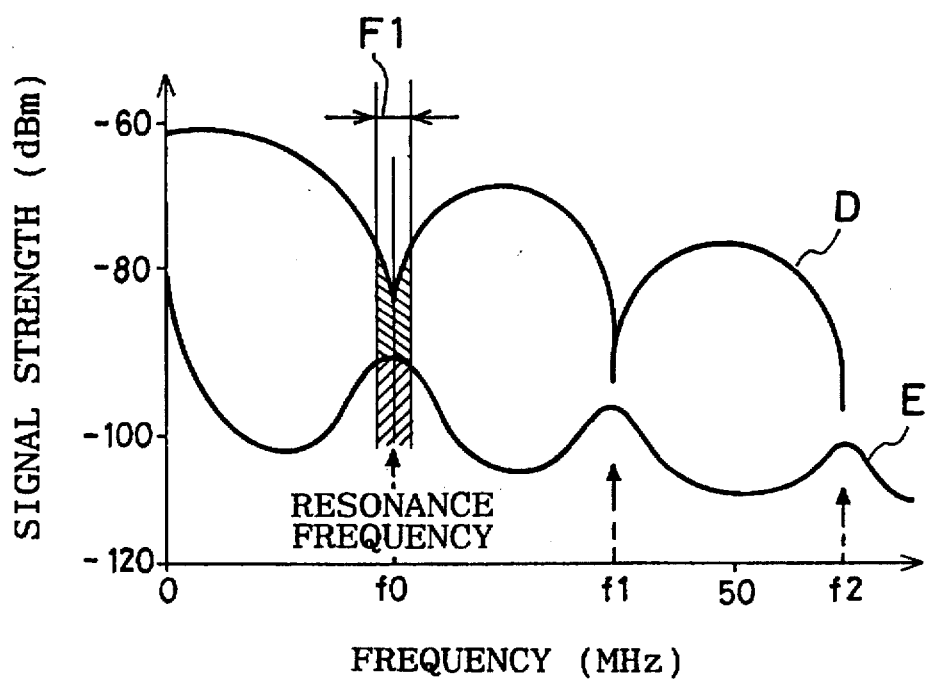
FIG. 13 is a characteristic diagram showing the detected strength (dBm) vs. frequencies (MHz) of partial discharge signals detected by a partial discharge sensor used in the embodiment 4 of the present invention, illustrating a band width ($F_1$) of passing frequencies of a narrow band filter circuit also.

FIG. 13 is a characteristic diagram showing the detected strength (dBm) vs. frequencies (MHz) of partial discharge signals detected by the partial discharge sensor 9 used in the embodiment 4, illustrating a band width ($F_1$) of passing frequencies of the narrow band filter circuit 23 also. As shown in the drawing, the passing frequency band of the narrow band filter 23 is selected within the extent of ±5% of the resonance frequency determined on the basis of the length of the stator core 3.

As described about the embodiment 3, a partial discharge signal has a characteristic that the strength of the partial discharge signal varies at the resonance frequency $f_0$ determined on the basis of the length of the stator core 3. Because a signal to be detected is a pulse-like high speed signal having weak strength, if the frequency band of the detection of it is narrow, the detected signal strength becomes weaker and the sensitivity of detection becomes low. Accordingly, the sensitivity of detection can be raised by widening the band width as shown in FIG. 13. However, if the band width is widened too much, radio noises other than the partial discharge signal are detected also. FIG. 13 shows the example in which the band width is set to be within the extent of the resonance frequency ±5%. By setting the band width $F_1$ to be $f_0 \pm 5\%$, the detection sensitivity of partial discharge in the slot 6 where the partial discharge sensor 9 is installed can be improved. The processes after this setting are identical to the processes in the embodiment 3.

Figure 14:
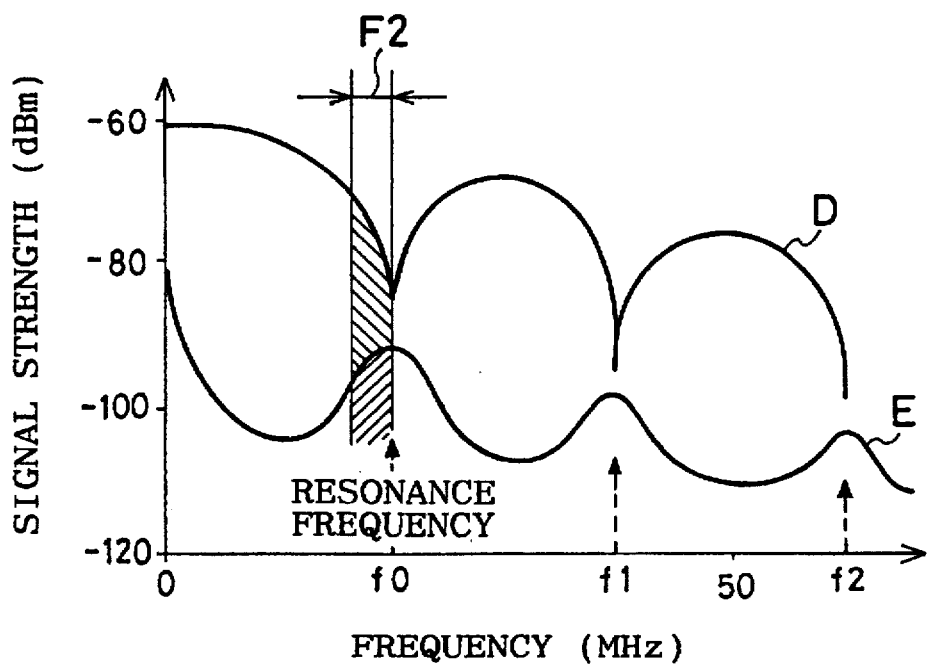
FIG. 14 is a characteristic diagram showing the detected strength (dBm) vs. frequencies (MHz) of partial discharge signals detected by a partial discharge sensor used in the embodiment 4 of the present invention, illustrating another band width ($F_2$) of passing frequencies of a narrow band filter circuit also.
Figure 15:
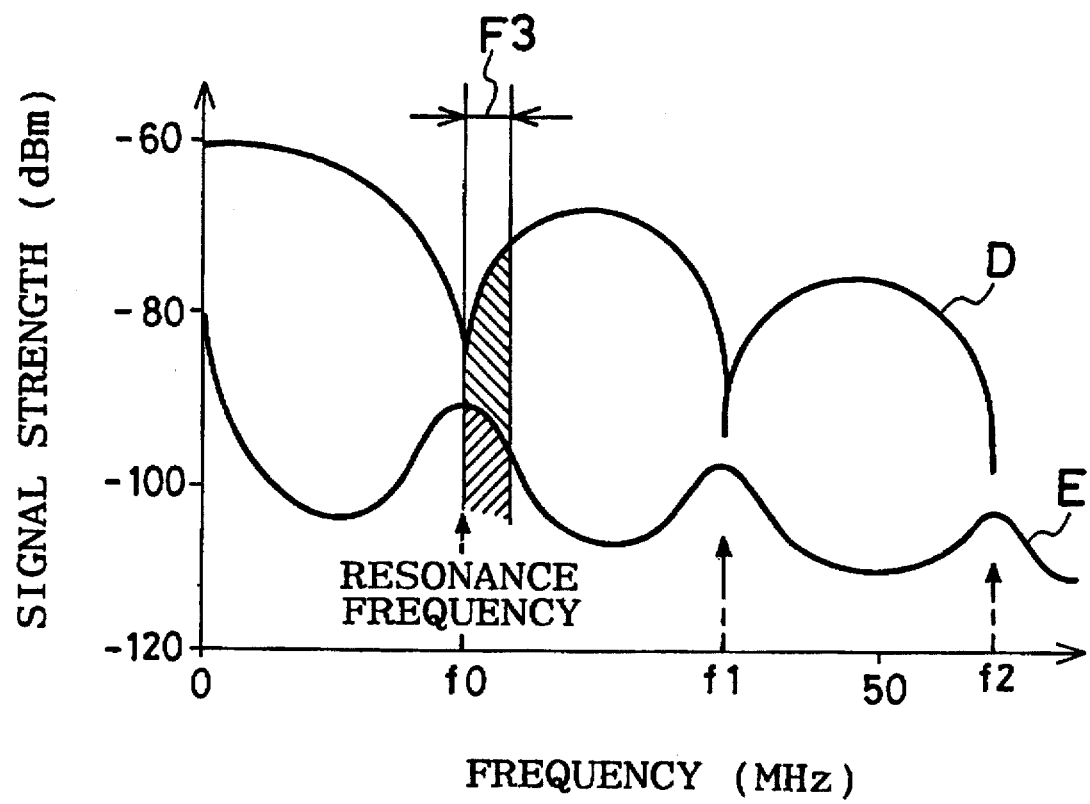
FIG. 15 is a characteristic diagram showing the detected strength (dBm) vs. frequencies (MHz) of partial discharge signals detected by a partial discharge sensor used in the embodiment 4 of the present invention, illustrating further other band width ($F_3$) of passing frequencies of a narrow band filter circuit also.

As shown in FIG. 14, the same effects as ones obtained in the embodiment 3 are obtained by setting the passing frequency band width $F_2$ of the filter circuit 23 to be within the extent of the resonance frequency $f_0 - 10\%$, which resonance frequency $f_0$ is determined on the basis of the length of the stator core 3. Besides, as shown in FIG. 15, the same effects can be obtained by setting the passing frequency band width $F_3$ of the filter circuit 23 to be within the extent of the resonance frequency $f_0$ 10%.

In this embodiment, the examples where the extent of widening the band widths from the resonance frequency $f_0$ is set to be ±5%, −10% and +10% are shown, however the extent of the widening is not restricted to these values but may be any other extent provided that it is in the neighborhood of the resonance frequency $f_0$ and radio noises are removed to enable the measurement of partial discharge signal by setting the extent. Furthermore, the band width may be determined by the measurement of the effects of the setting of the extent in which the resonance frequency $f_0$ is set as the central value. Besides, the abnormality detecting apparatus of the embodiment may be constructed so as to deal with the electric equipment having the different length of its stator core by employing a narrow band filter circuit 23 the passing frequency band of which is variable.

Embodiment 5

Figure 16:
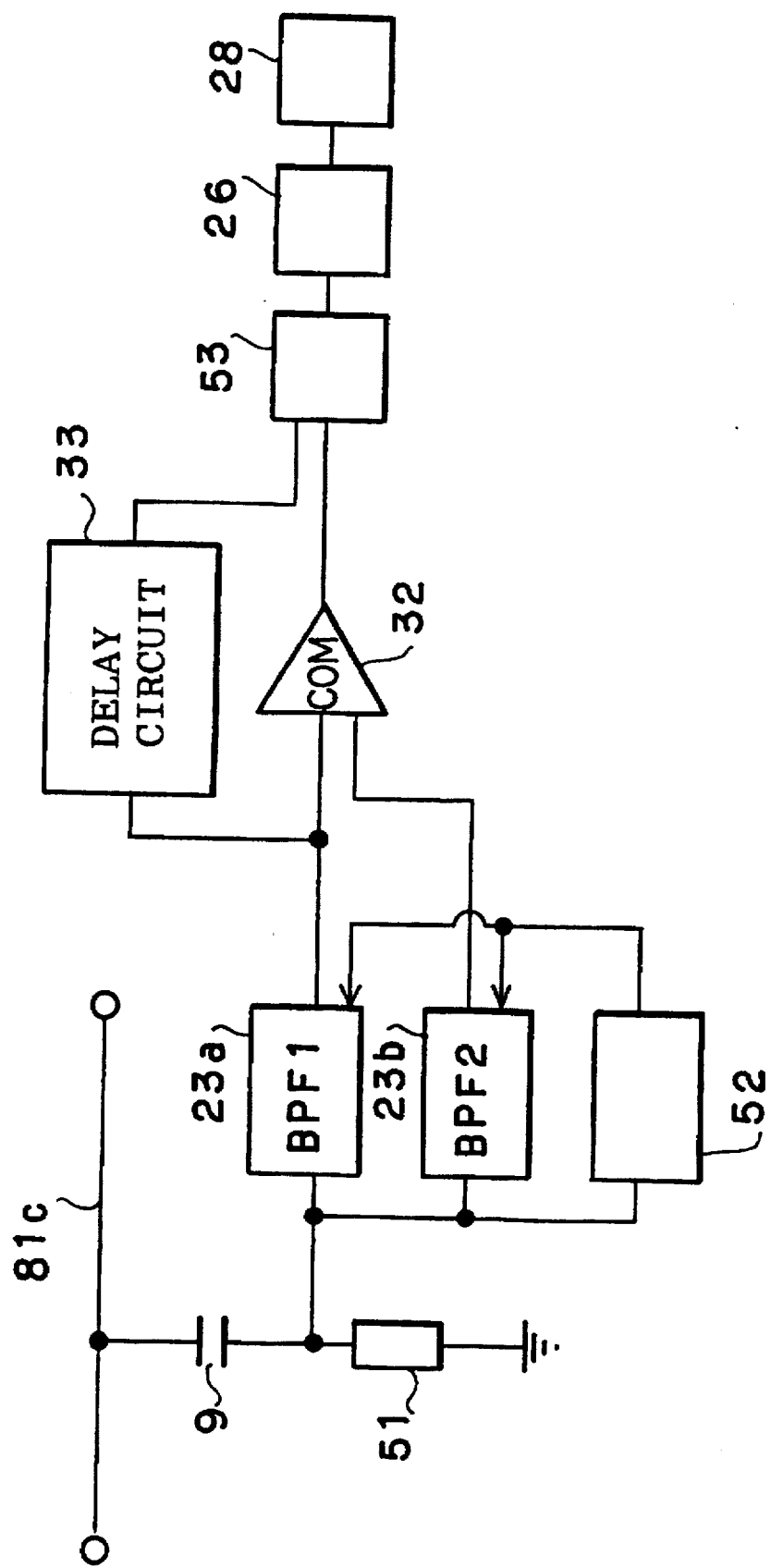
FIG. 16 is a block diagram showing an abnormality detecting apparatus using the abnormality detecting method for electric equipment of the embodiment 4 of the present invention.

Hereinafter, the embodiment 5 of the present invention will be described with referring to the drawings. FIG. 16 is a block diagram showing an abnormality detecting apparatus using the abnormality detecting method for electric equipment of the embodiment 5 of the present invention. In this embodiment, similarly in the embodiments 1 and 2, the resonance frequency $f_0$ of the supplied equipment and its measuring circuits is measured, and the strength of a detected signal at a predetermined frequency larger than the measured resonance frequency $f_0$ is measured. Then, each signal characteristic amount of the detected signals are grasped on the basis of the signal strength of the two partial discharge signals, the ratios of the signal strength in this case.

In this embodiment, as for the electric equipment, for example, the generator shown in the embodiment 2 is supposed.

And, reference numerals 23a and 23b designate narrow band filter circuits for receiving the signal detected by the partial discharge signal 9, and reference numeral 33 designates a delay circuit receiving the signal having passed the narrow band filter circuit 23a and delays the received signal by a predetermined period of time.

The frequency characteristics of a partial discharge signal generated at the high voltage bus 81c, a partial discharge signal generated at the generator 80 and a partial discharge signal generated at the transformer 50 in the construction shown in FIG. 6 were illustrated in FIG. 7(a) to FIG. 7(c), and mark $f_{ao}$ in FIG. 7(a), FIG. 7(b) and FIG. 7(c) designates the resonance frequency of the high voltage bus 81c, and mark $f_{bo}$ in FIG. 7(b) designates the resonance frequency of the stator winding of the generator 80 where partial discharge was generated. There can be found no definite resonance frequency in the frequency characteristic shown in FIG. 7(c). Thus, the frequency characteristics are delicately different from each other in accordance with the place where partial discharge is generated. Since the first order resonance frequencies are different from each other, the second order resonance frequencies of them are different from each other as a matter of course. Accordingly, the generation source of partial discharge can be specified on the basis of the values of resonance frequencies. Moreover, the characteristics of each signal can be grasped by measuring the strength ratio of the signals at the resonance frequency $f_0$ and at a frequency $f_1$ other than the resonance frequency $f_0$ (the signal strength at the frequency $f_1$ / the signal strength at the frequency $f_0$).

Referring to FIG. 16, the resonance frequency $f_0$ and a frequency, other than the resonance frequency $f_0$, larger than the frequency $f_0$, for example the second order resonance frequency $f_1$ are determined by measuring the signal detected by the partial discharge sensor 9 with the spectrum analyzer 52. Then, the first order resonance frequency $f_0$ is selected as the passing frequency band of the narrow band filter circuit 23a, and the second order resonance frequency $f_1$ is selected as the passing frequency band of the narrow band filter circuit 23b. And each narrow band filter circuit 23a, 23b transmits signals having frequency components fitted to each passing frequency band respectively. While the generator is operated, the narrow band filter circuit 23a passes the signal having the first order resonance frequency $f_0$ and the narrow band filter circuit 23b passes the signal having the second order resonance frequency $f_1$ respectively, and the signals are transmitted to the signal strength comparing circuit 32. The signal strength comparing circuit 32 compares the strength of the signals having passed through the two narrow band filters 23a and 23b respectively to transmit the result of the comparison to the partial discharge measuring circuit 53. The partial discharge measuring circuit 53 measures the output signal of the narrow band filter circuit 23a delayed by the delay circuit 33 on the basis of the result of the comparison, and measures the characteristic amounts such as generation places and the amount of generation. The operation of the partial discharge generation processing circuit 26 and the display unit 28 is the same as the operation of them used in the embodiment 1.

In this embodiment, the passing frequency bands of the two narrow band filter circuits 23a and 23b are set to be the first order resonance frequency $f_0$ and the second order resonance frequency $f_1$ respectively, however these passing frequency bands are not limited to those frequencies. That is to say, if these passing frequency bands are set to be a frequency in the neighborhood of the resonance frequency $f_0$ and a predetermined frequency larger than the frequency in the neighborhood of the resonance frequency $f_0$ respectively, partial discharge signals can be detected accurately by measuring generation places and the characteristic amounts such as the amount of generation on the basis of the amounts of the variations of the signal strength at the frequency in the neighborhood of the resonance frequency $f_0$ and the signal strength at the frequency larger than the frequency in the neighborhood of the resonance frequency $f_0$.

As described above, according to this embodiment, in the case where there are plural places where partial discharge is generated in the electric equipment, each partial discharge has respective resonance frequency in accordance with the supplied electric equipment and its measuring circuits, and consequently, it is enabled to detect partial discharge generated during the operation of the electric equipment in a state of operating it by comparing the strength of the signals having the resonance frequencies of each partial discharge with the strength of the signals having the higher frequency band than the resonance frequencies such as the second order resonance frequencies. Further, the embodiment can specify the partial discharge signal of every generation source.

As for the embodiment 5, the case where plural partial discharge signals are specified was described, however the signal sources to be detected are not restricted to the partial discharge signals, but signal sources which have peculiar frequency characteristics may be detected. For example, even if the signal sources are the plural kinds of noise signals, they are distinguishable by grasping the characteristic amount of them in the same way.

Embodiment 6

Figure 18:
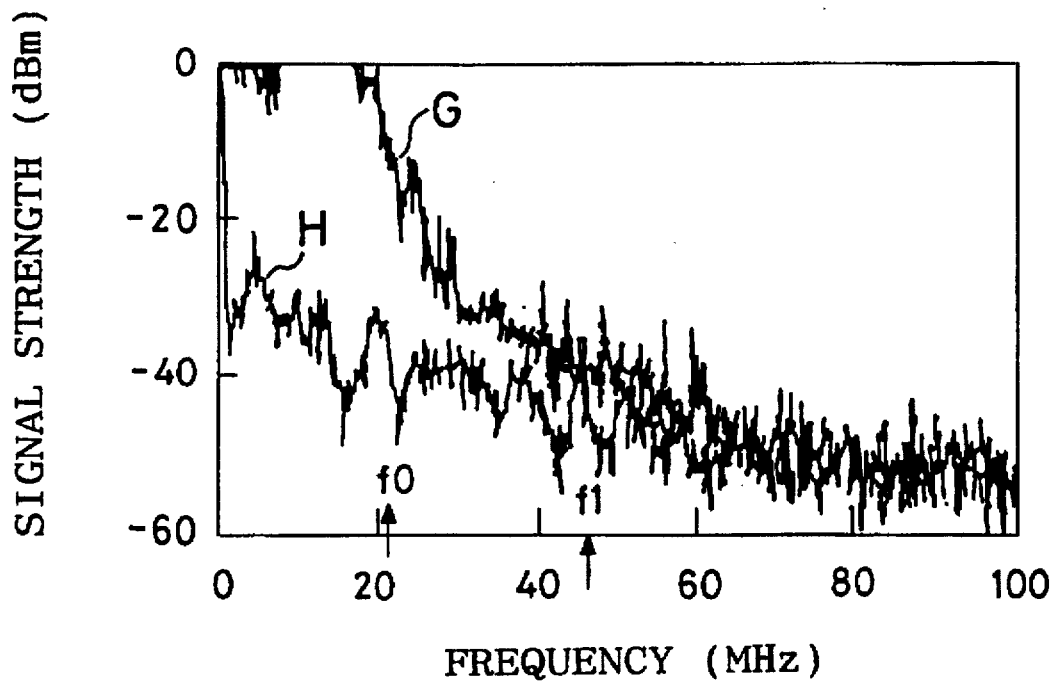
FIG. 18 is a characteristic diagram showing a partial discharge signal and a radio noise generated in the embodiment 6, the axis of abscissa of which denotes frequencies (MHz) and the axis of ordinate of which denotes detected strength (dBm)

Hereinafter, the embodiment 6 of the present invention will be described with referring to the drawings. FIG. 17 is a block diagram showing the abnormality detecting apparatus of the embodiment 6, and FIG. 18 is a characteristic diagram showing a partial discharge signal H and a radio noise G measured during the operation of a thermal turbine generator whose rated capacity is 156000 kW and whose rated voltage is 18 kV, the axis of abscissa of FIG. 18 denotes frequencies (MHz) and the axis of ordinate of FIG. 18 denotes detected strength (dBm). In these drawings, the same reference numerals as those of FIG. 8(a)–FIG. 12 of the embodiment 3 designate the same or the corresponding parts.

Referring to FIG. 17, the construction of the generator 1, the construction of the partial discharge sensor 9 and its installed position, and the composition of the detector 10a and the lead wires 19a are same as those of the embodiment 3. The output signal of the detector 10a is divided into two parts, and one of them is inputted into the first narrow band filter circuit 23a and the other of them is inputted into the second narrow band filter circuit 23b. The first narrow band filter circuit 23a passes the same frequency component as the resonance frequency $f_0$ determined on the basis of the length of the stator core 3 of the generator. The one signal of the divided signals is inputted into the first narrow band filter circuit 23a to be lead into the peak hold circuit 30, and further is transmitted to the signal strength comparing circuit 32 through the A / D converter 31. And, the second narrow band filter circuit 23b passes a predetermined frequency component larger than the resonance frequency $f_0$. The other signal of the divided signals is inputted into the second narrow band filter circuit 23b to be transmitted to the peak hold circuit 30 and the A / D converter 31, and further is transmitted to the signal strength comparing circuit 32.

Furthermore, the outputted signal of the signal strength comparing circuit 32 is transmitted to an elimination circuit 34.

Besides, the embodiment is constructed so as to divide the output signal of the first narrow band filter circuit 23a into two parts, one of which is lead to the peak hold circuit 30, the other of which is transmitted to the elimination circuit 34 through a delay circuit 33. A noise distinguishing circuit 25 is composed of the peak hold circuits 30, the A / D converters 31, the signal strength comparing circuit 32, the delay circuit 33 and the elimination circuit 34. The output signal of the elimination circuit 34 is transmitted to the partial discharge generation processing circuit 26, the display unit 28 and the abnormality displaying apparatus 29, and the construction of these devices which process the output signal of the elimination circuit 34 is the same as those of the embodiment 3.

Next, the operation of this embodiment will be described. It was found that there were peculiar differences between the frequency characteristics of the partial discharge signal H and a radio noise G, both of which were generated during the operation of the generator 1, as a result of the detailed analysis of both of them measured by the partial discharge sensor 9. FIG. 18 shows respective frequency characteristic of them. In the figure, the upper characteristic at the frequency $f_0$ denotes the frequency characteristic of the radio noise G from the outside, and the lower characteristic at the frequency $f_0$ denotes the frequency characteristic of the partial discharge signal H. The partial discharge signal H has harmonic components to the neighborhood of 100 MHz, and shows the gentle decrease of the signal strength in proportion as the frequency increases. On the other hand, the radio noise G has a strength larger than the strength of the partial discharge signal H, but the radio noise G has less harmonic component, and shows the steep descent of the signal strength in proportion as the frequency increases.

The partial discharge signal H shown in FIG. 18 includes the partial discharge signal D generated in the slot where the partial discharge sensor 9 is installed and the partial discharge signal E generated in a slot where the partial discharge sensor 9 is not installed (or generated in a slot in a distance from the partial discharge sensor 9), both of which signals D and E are shown in FIG. 11.

The differences between these frequency characteristics are caused by the difference of the generation phenomena of the partial discharge signal H and the radio noise G, and by the difference of the propagation characteristics of these signals H and G to the partial discharge sensor 9. In FIG. 18, mark $f_0$ designates the first order resonance frequency, and mark $f_1$ designates the second order resonance frequency. It was made to be clear from these differences between the frequency characteristics of the signals G and H that there were peculiar differences between the signal strength at the resonance frequency $f_0$ determined on the length of the stator core and the signal strength at a frequency in a prescribed frequency band larger than the resonance frequency $f_0$ by comparing both the signal strength.

This embodiment detects partial discharge signals by utilizing the above described characteristics. The resonance frequency $f_0$ is obtained on the basis of the length of the stator core 3 in conformity with the equation 1, and the resonance frequency $f_0$ is set as the passing frequency band of the first narrow band filter circuit 23a. The signal detected by the partial discharge sensor 9 during the operation of the generator is divided into two part, one of which is passed through the first narrow band filter circuit 23a, which passes the same frequency component as the resonance frequency $f_0$, and the strength of the signal outputted from the first narrow band filter circuit 23a is detected by the peak hold circuit 30. The signal strength detected by the peak hold circuit 30 is converted from the analogue signal to the digital signal by the A / D converter 31 to be transmitted to the signal strength comparing circuit 32. On the other hand, the other divided signal is passed through the second narrow band filter circuit 23b, which passes a predetermined frequency component larger than the resonance frequency $f_0$, for example the frequency $f_1$ being two times as large as the frequency $f_0$, and the strength of the signal outputted from the second narrow band filter circuit 23b is detected by the peak hold circuit 30. The signal strength detected by the peak hold circuit 30 is transmitted to the signal strength comparing circuit 32 through the A / D converter 31. The signal strength comparing circuit 32 compares the strength of two signals having the resonance frequency $f_0$ and the frequency $f_1$ respectively, provided that the strength is larger than a predetermined level.

Based on the difference between the frequency characteristics of a partial discharge signal and a radio noise, it can be judged that the partial discharge signal is the signal having the larger strength ratio of the signals in the two frequency bands {(the signal strength at the frequency $f_1$) / (the signal strength at the resonance frequency $f_0$)}. And, it is judged that the radio noise is the signal having steeper descent in signal strength in proportion to the increment of the frequency, that is to say the signal having the smaller strength ratio of the signals in the two frequency bands.

Thus, the signal strength comparing circuit 32 distinguishes the partial discharge signal from the radio noise to transmit the result of the distinction to the elimination circuit 34. On the other hand, the signal passed through the first narrow band filter 23a is divided to be delayed by the delay circuit 33 by the period of time necessary to the aforementioned distinction of the partial discharge signal from the radio noise, and further the delayed signal is transmitted to the elimination circuit 34. The elimination circuit 34 turns its signal gate from the delay circuit 33 on and off on the basis of the distinction results of the signal strength comparing circuit 32 to transmit only the partial discharge signal to the partial discharge generation processing circuit 26.

The constructions and the operation of the partial discharge generation processing circuit 26, the display unit 28 and the abnormality displaying apparatus 29 are the same as those in the embodiment 3.

In this embodiment, the second narrow band filter circuit 23b is set to pass the signal having the frequency $f_1$ being two times as large as the resonance frequency $f_0$, however the passing frequency band of the second narrow band filter circuit 23b is not limited to the frequency, but it may a frequency band passing a predetermined frequency component larger than the resonance frequency $f_0$, and by thus setting the frequency band, partial discharge signal can be distinguished from radio noise on the basis of the difference of the descent of the signal strength in proportion to the frequency.

Thus, by comparing the signal strength at the resonance frequency $f_0$ determined on the basis of the length of the stator core of a rotating electric machine and the signal strength at a predetermined frequency larger than the resonance frequency $f_0$, a partial discharge signal is separated from a radio noise to eliminate the separated radio noise by using the frequency characteristics of the signals detected by a partial discharge sensor, and consequently, the partial discharge generated during the operation of the rotating electric machine can be detected in the operated state of the rotating electric machine. Furthermore, by eliminating radio noises, partial discharge signal caused by the discharge where the small amount of electric charge is discharged, too, can be measured.

Embodiment 7

Figure 19:
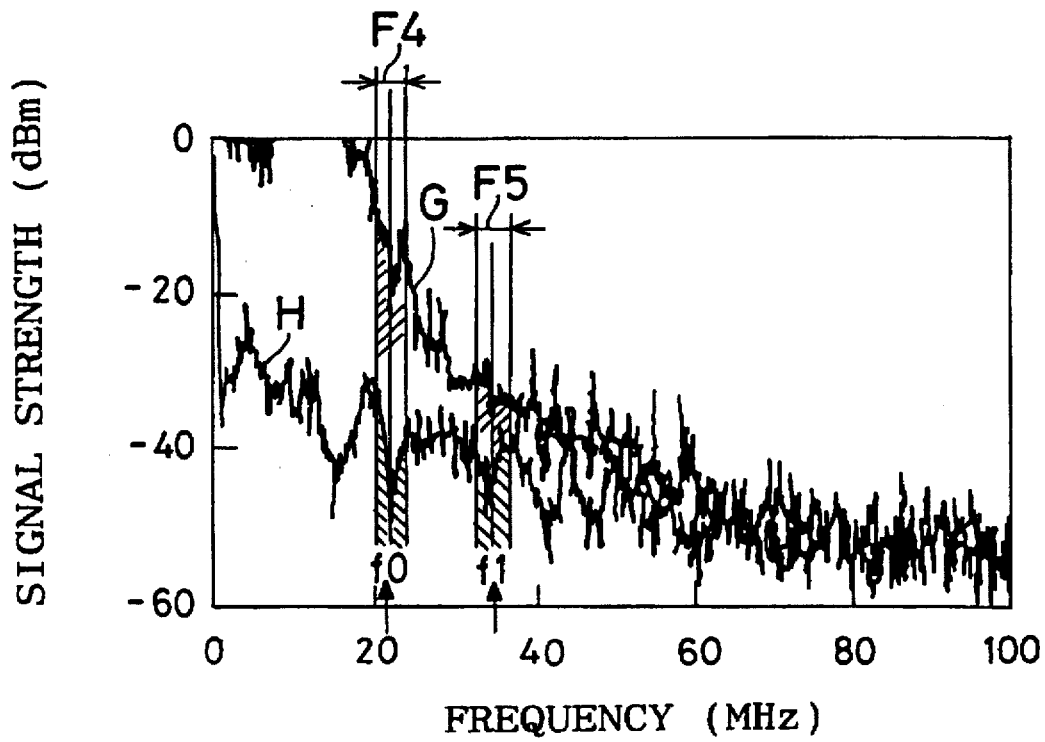
FIG. 19 is a characteristic diagram showing the detected strength (dBm) vs. frequencies (MHz) of partial discharge signals detected by a partial discharge sensor used in the embodiment 7 of the present invention, illustrating the band widths ($F_4$, $F_5$) of the passing frequencies of narrow band filter circuits also.

Hereinafter, the embodiment 7 of the present invention will be described with referring to drawings. FIG. 19 is a characteristic diagram showing the detecting bands of the first narrow band filter circuit 23a and the second narrow band filter circuit 23b of an insulation abnormality detecting apparatus for a rotating electric machine, for example, a generator according to the abnormality detecting apparatus of the embodiment 7, the axis of abscissa of which denotes frequencies (MHz) and the axis of ordinate of which denotes detected strength (dBm). FIG. 19 illustrates the passing frequency band widths $F_4$ and $F_5$ of the narrow band filter circuits 23a and 23b. The constructions of the embodiment other than the narrow band filter circuits 23a and 23b are the same as those of the embodiment 6.

Next, the operation of the embodiment 7 will be described.

As described about the embodiment 3, the signals detected by the partial discharge sensor 9 have characteristics where signal strength greatly varies at the resonance frequency $f_0$ determined on the basis of the length of the stator core 3 of a generator. This resonance frequency $f_0$ is characterized by being different from each generator, because every design factor differs in accordance with the rated capacities and the generation ratings of generators and so forth. In the embodiment 6, partial discharge signals are separated from radio noises on the basis of the ratios of the signal strength at the second order resonance frequency $f_1$ to the signal strength at the first order resonance frequency $f_0$.

However, in the case where the band widths for detecting the resonance frequencies are narrow like in the embodiment 6, it becomes easy to produce the gap between the detected signals and the resonance frequencies. And, the gap of a detected band in a band where signal strength varies greatly becomes the gap of the signal strength to be detected, then it becomes difficult to present the feature of the difference between the frequency characteristics of a partial discharge signal and a radio noise.

Then, grasping the average values of the passing frequency bands of the narrow band filter circuits 23 makes the detection errors small, and makes it possible to grasp the features of the frequency characteristics of signals surely. That is to say, it is required to select the optimum detection frequencies $f_0$ and $f_1$ and the optimum detection band widths at the frequencies $f_0$ and $f_1$.

As shown in FIG. 19, the passing frequency band width $F_4$ of the first narrow band filter circuit 23a is set to be $f_0 \pm 10\%$, where $f_0$ denotes the first order resonance frequency determined on the basis of the length of the stator core 3, and the passing frequency band width $F_5$ of the second narrow band filter circuit 23b is set to be $f_0 \times 1.5 \pm 10\%$, where $f_0$ denotes the first order resonance frequency. Because the first order resonance frequency $f_0$ of this generator is 24 MHz, the passing frequency band of the first narrow band filter circuit 23a is set to be 24 MHz, and its band width $F_4$ is set to be 24 MHz±10%. Besides, the passing frequency band of the second narrow band filter circuit 23b is set to be 35 MHz, which is about 1.5 times as large as the first order resonance frequency $f_0$, and its band width $F_5$ is set to be 35 MHz±10%.

Figure 20:
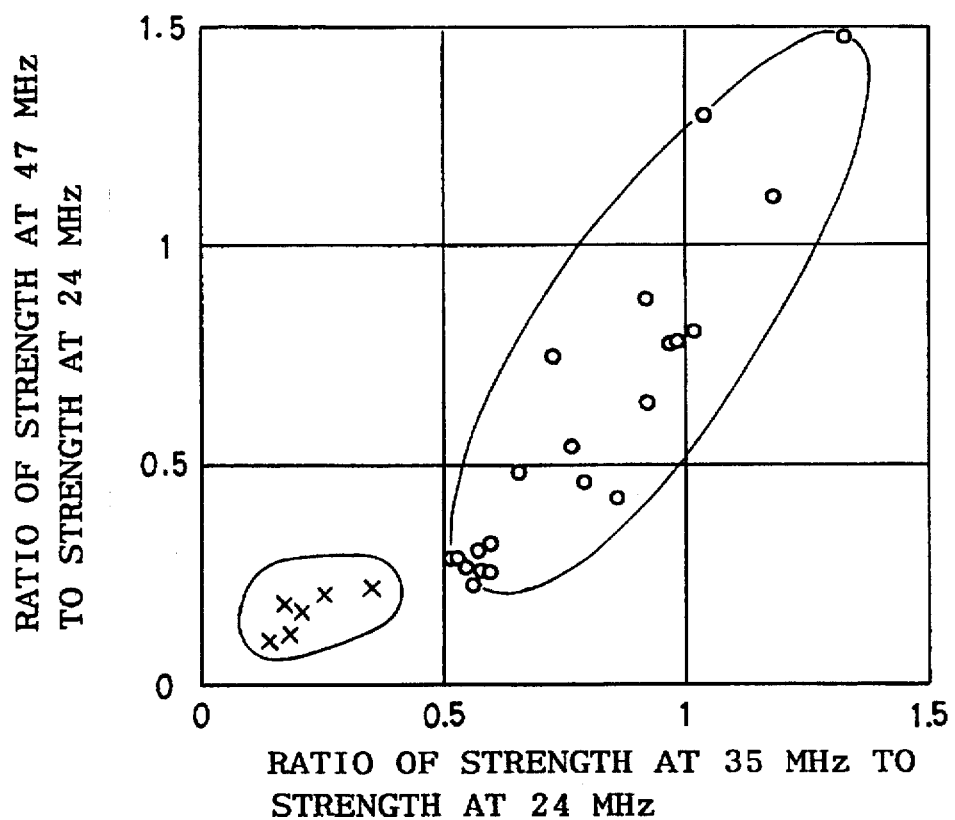
FIG. 20 is an explanatory view showing the comparison of the ratios of the strength between two band widths of passing frequencies of the embodiment 7.

FIG. 20 illustrates the results of the distinction of partial discharge signals from radio noises on the basis of measured data of the partial discharge in the generator during its operation by the use of this abnormality detecting apparatus. The axis of abscissa of FIG. 20 denotes the ratios of the signal strength under the setting of the passing frequency band of the first narrow band filter circuit 23a to be 24 MHz and under the setting of the passing frequency band of the second narrow band filter 23b to be 35 MHz, which is about 1.5 times as large as the first order resonance frequency $f_0$. The axis of ordinate of FIG. 20 denotes the ratios of the signal strength under the setting of the passing frequency band of the first narrow band filter circuit 23a to be 24 MHz and under the setting of the passing frequency band of the second narrow band filter 23b to be 47 MHz, which is about 2 times as large as the first order resonance frequency $f_0$. In FIG. 20, marks 0 designate partial discharge signals, and marks×designate radio noises.

Referring to FIG. 20, from the view point of the ratios of the strength at 24 MHz and the strength at 35 MHz, the data can clearly be separated as follows: the data having larger strength ratios than 0.5 designate partial discharge signals, and the data having smaller strength ratios than it designates radio noises. In opposition to this, in case of the view point of the ratios of the strength at 24 MHz and the strength at 47 MHz, the data can be separated but not clearly as follows: the data having larger strength ratios than 0.25 designate partial discharge signals, and the data having smaller strength ratios than it designates radio noises. The comparison between the datum distributions from the view points of the axis of abscissa and the axis of ordinate, especially around the boundary values of separating the data of partial discharge signals and the data of radio noises, brings it clear that the way of setting the frequencies for obtaining the signal strength ratios of the axis of abscissa, where the frequencies are set to be 24 MHz and 35 MHz, results the better sensitivity.

After separating partial discharge signals from radio noises at the signal strength comparing circuit 32, the separated results are transmitted to the elimination circuit 34. The constructions and the operation of the elimination circuit 34, the delay circuit 33, the partial discharge generation processing circuit 26, the display unit 28 and the abnormality displaying apparatus 29 are the same as those of the embodiment 6.

Thus, in this embodiment, the passing frequency band of the first narrow band filter circuit 23a is set to be the resonance frequency $f_0 \pm 10\%$, and the passing frequency band of the second narrow band filter circuit 23b is set to be the 1.5 times as large as the resonance frequency $f_0 \pm 10\%$. And, from the values of the strength ratios of the two narrow band signals, partial discharge signals can clearly be separated from radio noises in the state of the operation of a rotating electric machine.

Embodiment 8

Hereinafter, the embodiment 8 of the present invention will be described with referring to the drawings. As for the embodiment 7, the description was made to the example where the strength of the signal having the frequency within the resonance frequency $f_0 \pm 10\%$, which frequency $f_0$ is determined on the basis of the length of the stator core, and the strength of the signal having the frequency within 1.5×$f_0$35 10% were compared when partial discharge signals were separated from radio noises out of the signals detected by the partial discharge sensor. But, the present invention is not limited to this example, and some other examples will now be described.

Figure 21:
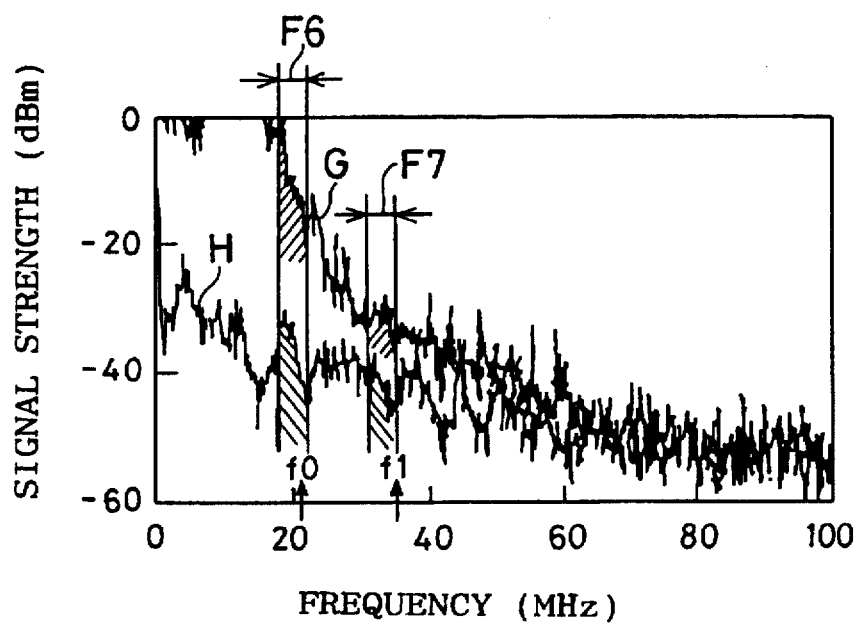
FIG. 21 is a characteristic diagram showing the detected strength (dBm) vs. frequencies (MHz) of partial discharge signals detected by a partial discharge sensor used in the embodiment 8 of the present invention, illustrating band widths ($F_6$, $F_7$) of passing frequencies of narrow band filter circuits also.

FIG. 21 is a characteristic diagram showing the frequency characteristics of a partial discharge signal H and a radio noise G when partial discharge is measured during the operation of the same turbine generator as used in the embodiment 7. The detecting frequency band $F_6$ of the first narrow band filter circuit 23a is set to be from the first order resonance frequency 24 MHz to 24–15% MHz, and the detecting frequency band $F_7$ of the second narrow band filter circuit 23b is set to be from 35 MHz, which is 1.5 times as large as the first order resonance frequency $f_0$, to 35–15 MHz. That is to say, the detecting band widths are set to take frequency bands by 15% toward the side of lower frequencies from the resonance frequency $f_0$ and the frequency of $1.5 \times f_0$ respectively. In this case, also, like in the embodiment 7, the following effect is obtained: partial discharge signals can clearly be separated from radio noises on the basis of the values of the ratios of the strength of the two narrow band signals.

The constructions and the operation of the partial discharge sensor 9, the noise distinguishing circuit 25, the partial discharge generation processing circuit 26, the display unit 28 and the abnormality displaying apparatus 29 are the same as those of the embodiment 6.

Figure 22:
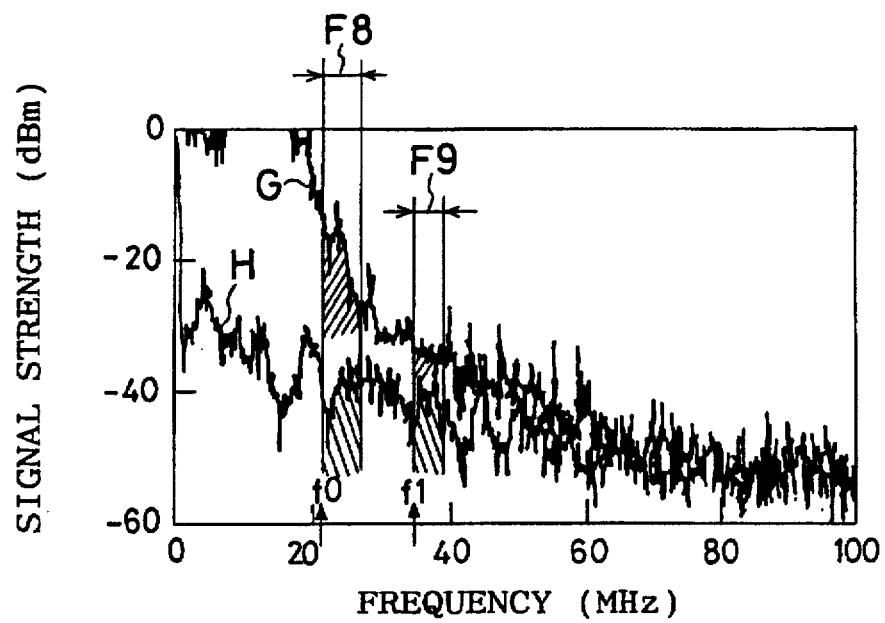
FIG. 22 is a characteristic diagram showing the detected strength (dBm) vs. frequencies (MHz) of partial discharge signals detected by a partial discharge sensor used in the embodiment 8 of the present invention, illustrating other band widths ($F_8$, $F_9$) of passing frequencies of narrow band filter circuits also.

Furthermore, as shown in FIG. 22, in the case where the passing frequency band width $F_8$ of the first narrow band filter circuit 23a is taken by 15% toward the side of higher frequencies from the first order resonance frequency $f_0$, and the passing frequency band width of the second narrow band filter circuit 23b is taken by 15% toward the side of higher frequencies from the frequency of $1.5 \times f_0$, also, like described above, the following effect is obtained: partial discharge signals can clearly be separated from radio noises on the basis of the values of the ratios of the strength of the two narrow band signals.

Furthermore, as for the band widths of the narrow band filter circuit 23a and 23b, the description was made to the band widths set to be ±10% of $f_0$ and $f_1$, −15% of $f_0$ and $f_1$ and +15% of $f_0$ and $f_1$ concerning the embodiments 7 and 8, the band widths of the present invention are not limited to those values. The values may be the values in a frequency band including the resonance frequency $f_0$ determined on the basis of the length of the stator core and a predetermined frequency band larger than the resonance frequency $f_0$, provided that the values clearly indicate the features of frequency characteristics.

Embodiment 9

Figure 23:
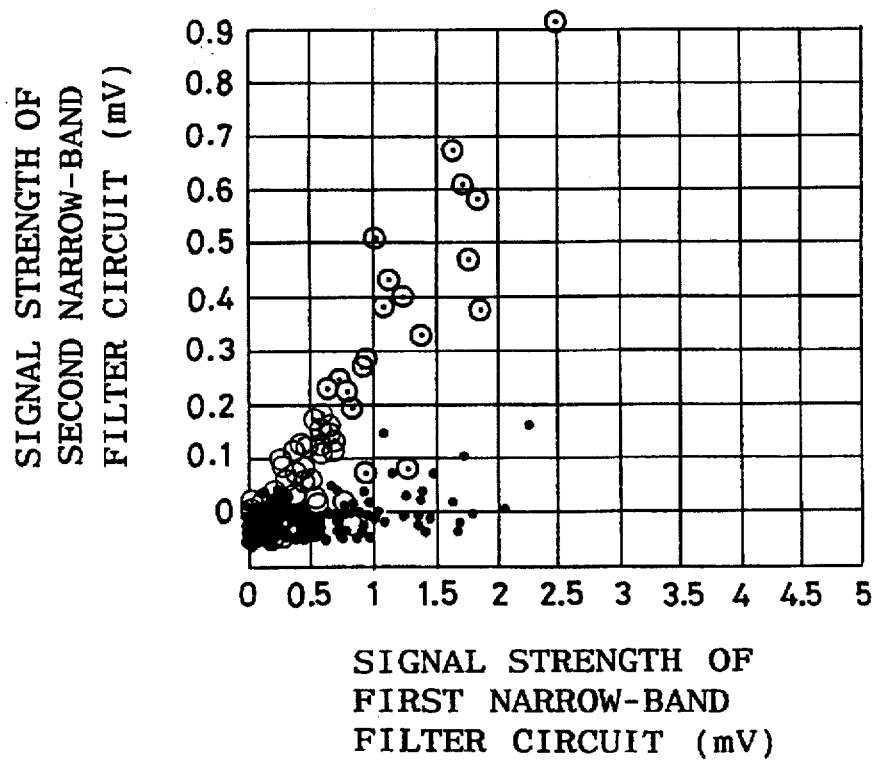
FIG. 23 is a graph illustrated on the measured data of partial discharge signals and radio noises of the abnormality detecting apparatus for a rotating electric machine of the embodiment 9 of the present invention, the axis of abscissa of which denotes the signal strength (mV) of a first narrow band filter circuit and the axis of ordinate of which denotes the signal strength (mV) of a second narrow band filter circuit.

Hereinafter, the abnormality detecting apparatus for a rotating electric machine of the embodiment 9 of the present invention will be described with referring to the drawings. FIG. 23 is a graph showing the results of the measurement of partial discharge signals and radio noises during the operation of a thermal turbine generator, whose rated capacity is 600 MW and whose rated voltage is 19 kV, with the usage of the abnormality detecting apparatus of the embodiment 9. In this abnormality detecting apparatus, the central frequency of the passing frequency band of the first narrow band filter circuit 23a is set to be 13 MHz, which is the first order resonance frequency, and the band width of the passing frequency band is set to be 3 MHz. And, the central frequency of the passing frequency band of the second narrow band filter circuit 23b is set to be 24.5 MHz, which is the second order resonance frequency, and the band width of the passing frequency band is set to be 3 MHz. The other constructions of the embodiment are the same as those of the embodiment 6.

The axis of abscissa of FIG. 23 denotes the output signal strength (mV) of the first narrow band filter circuit 23a, and the axis of ordinate of FIG. 23 denotes the output signal strength (mV) of the second narrow band filter circuit 23b. And in FIG. 23, marks ● designate radio noises, and marks ○ designate partial discharge signals. As is obvious from the figure, the partial discharge signals ○ can be separated from the radio noises ● with, for example, a straight line the slope of which is 0.16. That is to say, the data are distinguished as follows: the data in the upper side of the straight line are the data of the partial discharge signals and the data in the under side of the straight line are the data of the radio noises.

Thus, in case of rotating electric machines, for example generators, the sizes of their stator cores 3 and their stator windings 4 are different in accordance with their rated capacities, and accordingly, by selecting the passing frequency bands of the first narrow band filter circuit 23a and the second narrow band filter circuit 23b to each generator, there can be obtained the abnormality detecting apparatus which can clearly separate partial discharge signals from radio noises to detect abnormalities for rotating electric machines having every rated capacity without being limited to the frequency bands shown in connection with the embodiments 7 and 8.

Besides, the frequency characteristics of signals also somewhat differs in accordance with generators to be measured. Accordingly, the threshold value for distinguishing signals is not limited to the judgement using the ratios of two signal strength, which judgment was shown in connection with the embodiment 7, but it may be applicable to judge on the basis of the values of signal strength themselves, as shown in connection with the embodiment 9. Moreover, the judgement may be done on the basis of the values obtained by calculating the differences between two signal strength. Furthermore, the threshold values used in the judgement may be decided from the signal characteristics measured with respect to each rotating electric machine.

Embodiment 10

Figure 24:
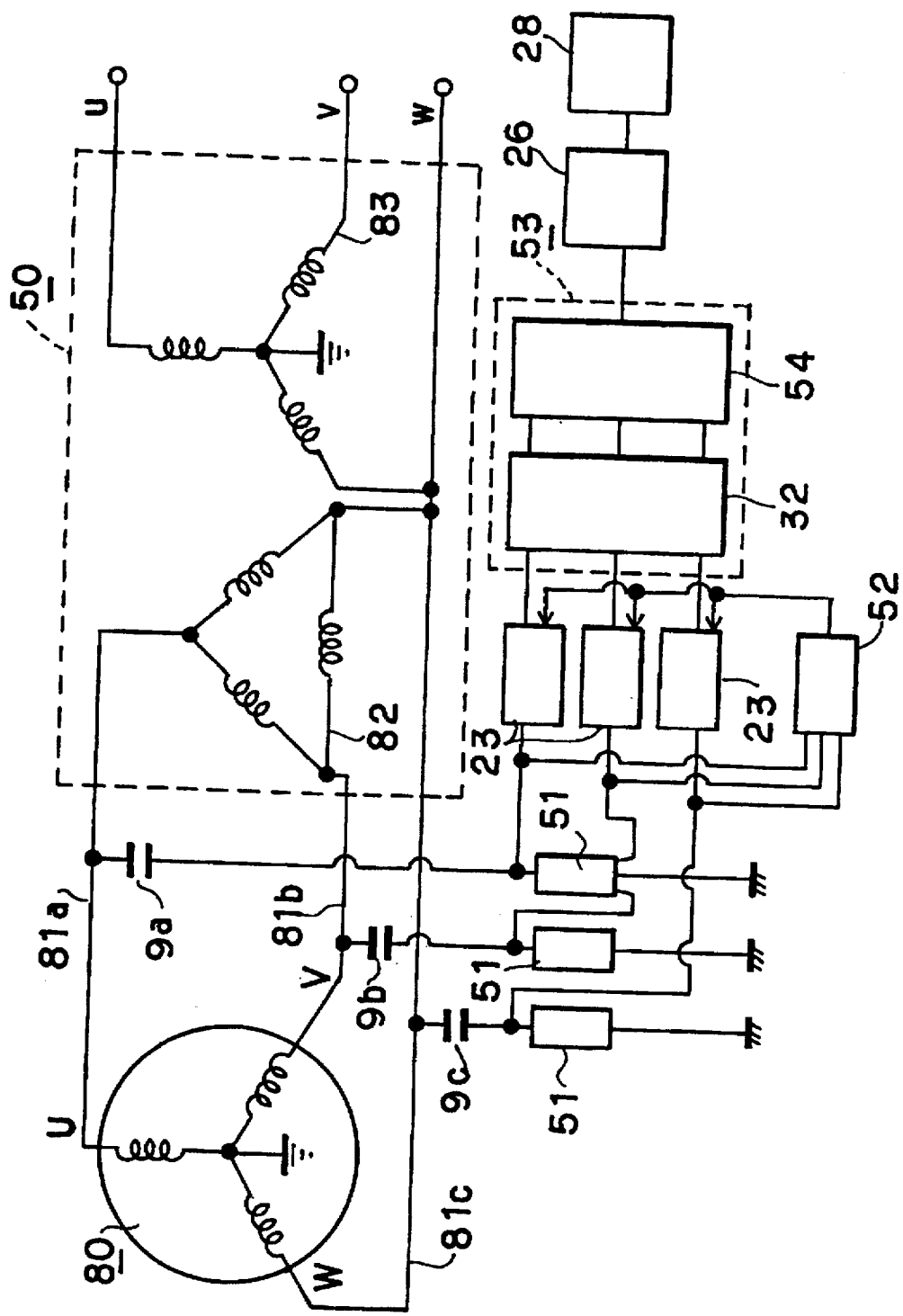
FIG. 24 is a block diagram showing an abnormality detecting apparatus using the abnormality detecting method for electric equipment of the embodiment 10 of the present invention.

Hereinafter, the embodiment 10 of the present invention will be described with referring to the drawings. FIG. 24 is a block diagram showing an abnormality detecting apparatus using the abnormality detecting method for electric equipment of the embodiment 10. In the figure, the same reference numerals as those in FIG. 6 with regard to the embodiment 2 designate the same parts as or the corresponding parts to the parts of the embodiment 2.

In FIG. 24, reference numeral 80 designates a generator, and reference numeral 50 designates a transformer. The electricity generated by the generator 80 is supplied to the primary windings 82 of the transformer 50 through the high voltage buses 81a, 81b and 81c, and is stepped up at the secondary windings 83 to be supplied to the transmission system. The high voltage buses 81a, 81b and 81c are operated at high voltages from 10 kV to 25 kV. In this embodiment, the partial discharge sensors 9 are provided to every part of the high voltage buses 81a, 81b and 81c to detect the abnormalities of high voltage buses 81a–81c, the generator 80 and the transformer 50.

The partial discharge sensors 9a, 9b and 9c are provided to each high voltage bus 81a, 81b and 81c respectively, and the sensors 9a, 9b and 9c are grounded through the detecting impedance elements 51 respectively. The signals detected by the detecting impedance elements 51 are transmitted to the spectrum analyzer 52 and the narrow band filter circuits 23. Besides, the signals having passed through the narrow band filter circuits 23 pass the partial discharge measuring circuit 53 to be transmitted the partial discharge generation processing circuit 26. The partial discharge generation processing circuit 26, in turn, outputs the processed results to the display unit 28. The partial discharge measuring circuit 53 is composed of a signal strength comparing circuit 32 and a pulse height analyzing circuit 54.

Now, the operation of the embodiment 10 will be described with referring to FIG. 24, FIG. 7(a), FIG. 7(b) and FIG. 7(c).

High voltages are imposed on the high voltage buses 81a, 81b and 81c. Accordingly, if deterioration is caused in an insulator due to voltage deterioration, partial discharge is generated, and the signal of the partial discharge is propagated through the high voltage buses 81a, 81b and 81c in a high speed. The signal becomes a partial discharge signal having resonance frequencies determined on the basis of the lengths of the high voltage buses 81a, 81b and 81c and the measuring circuits as described in connection with the embodiment 1. The frequency characteristic of the partial discharge signal generated on the high voltage bus 81a is shown in FIG. 7(a).

When partial discharge is generated at the high voltage bus 81c, a partial discharge signal accompanied by the partial discharge is detected by the partial discharge sensor 9c, and is propagated through the generator 80 or the windings and the housing inside the transformer 50 to be transmitted to the high voltage buses 81a and 81b at the same time. Then the signal is detected by the partial discharge sensors 9a and 9b also. But the values detected by the partial discharge sensors 9a and 9b are smaller than the value detected by the partial discharge sensor 9c, because the partial discharge signal propagated to the high voltage buses 81a and 81b are attenuated greatly.

In the case where the partial discharge signal generated at the high voltage bus 81a is detected by the partial discharge sensors 9a, 9b and 9c, the value of the signal detected by the partial discharge sensor 9a is larger and the values of the signals detected by the partial discharge sensors 9b and 9c are smaller similarly.

In the same way, in the case where the partial discharge signal generated at the high voltage bus 81b is detected by the partial discharge sensors 9a, 9b and 9c, the values of the signal detected by the partial discharge sensor 9b is larger, and the values of the signals detected by the partial discharge sensors 9a and 9c are smaller.

Furthermore, in the case where the partial discharge signal generated at the generator 80 is detected by the partial discharge sensors 9a, 9b and 9c, which partial discharge signal has resonance frequencies related to the length of the windings of the generator 80, the values of the signals detected by the partial discharge sensors 9a, 9b and 9c are different from each other, and the differences depend on the place of the U-phase, the V-phase or the W-phase of the windings of the generator 80 where the partial discharge has been generated.

That is to say, in the case where the partial discharge has been generated at the U-phase winding, the partial discharge signal generated by the partial discharge is detected by the partial discharge sensor 9a in a larger signal level, and is detected by the partial discharge sensors 9b and 9c in smaller signal levels respectively. Furthermore, in the case where the partial discharge has been generated at the V-phase winding, the partial discharge signal is detected by the partial discharge sensor 9b in a larger signal level, and is detected by the partial discharge sensors 9a and 9c in smaller signal levels respectively. Furthermore, in the case where the partial discharge has been generated at the W-phase winding, the partial discharge signal is detected by the partial discharge sensor 9c in a larger signal level, and is detected by the partial discharge sensors 9a and 9b in smaller signal levels respectively. For example, in the case where the partial discharge generated at the W-phase winding of the generator 80 is detected by the partial discharge sensor 9c, the frequency characteristic of the detected signal is like shown in FIG. 7(b).

Thus, in the case where partial discharge is generated in the generator 80, the signal having resonance frequencies related to the windings of the generator 80 is measured by the tree partial discharge sensors 9a, 9b and 9c with the difference of its characteristic amount in accordance with its generated place.

Furthermore, in the case where partial discharge is generated in the transformer 50, a signal having a frequency characteristic corresponding to the propagation characteristic of the partial discharge signal in the transformer 50 is detected by the partial discharge sensors 9a, 9b and 9c as a signal having different characteristic in accordance with the place where the partial discharge has been generated.

By thus grasping the resonance frequencies and the strength of the signals detected by the plural partial discharge sensors 9a, 9b and 9c, the partial discharge signals having different characteristic amounts from the high voltage buses 81a, 81b and 81c, the generator 80 and the transformer 50 can be separated to specify the generation source.

The signals detected by the partial discharge sensors 9a, 9b and 9c are transmitted to the narrow band filter circuits 23 and the spectrum analyzer 52 through the detecting impedance elements 51. The spectrum analyzer 52 analyzes the frequencies of the signals detected by the partial discharge sensors 9a, 9b and 9c, and selects a resonance frequency of a signal from the partial discharge sensor which outputs the largest signal level in the neighborhood of its resonance frequency to transmit the signal to the narrow band filter circuits 23. The narrow band filter circuits 23 select their passing frequencies on the basis of the signals from the spectrum analyzer. In this embodiment, for example, all of the passing frequency bands of the three narrow band filter circuits 23 are set to be the same.

The partial discharge signals, only the predetermined frequency band components of which have passed the narrow band filter circuits 23, are transmitted to the partial discharge measuring circuit 53. In the partial discharge measuring circuit 53, the signal strength comparing circuit 32 compares the strength of transmitted signals, and the pulse height analyzing circuit 54 analyzes the pulse heights of partial discharge pulses. The pulse signals, the heights of which have been analyzed, are transmitted to the partial discharge generation processing circuit 26. The operation of the succeeding partial discharge generation processing circuit 26 and the display unit 28 are the same as those of the embodiment 2.

As described above, in this embodiment, the frequency spectra of the signals detected by the plural partial discharge sensors are measured, and the passing frequencies of the narrow band filter circuits are determined by selecting the resonance frequency determined on the basis of the electric equipment and the measuring circuits from the frequency spectra to compare the signal strength at the resonance frequency of the plural partial discharge sensors. Thereby, partial discharge generated during the operation of electric equipment can be detected in a operating state. Besides, signals having different characteristic amounts included the signals detected by the partial discharge sensors can be separated to specify partial discharge signals from each generation source.

Embodiment 11

Figure 27:
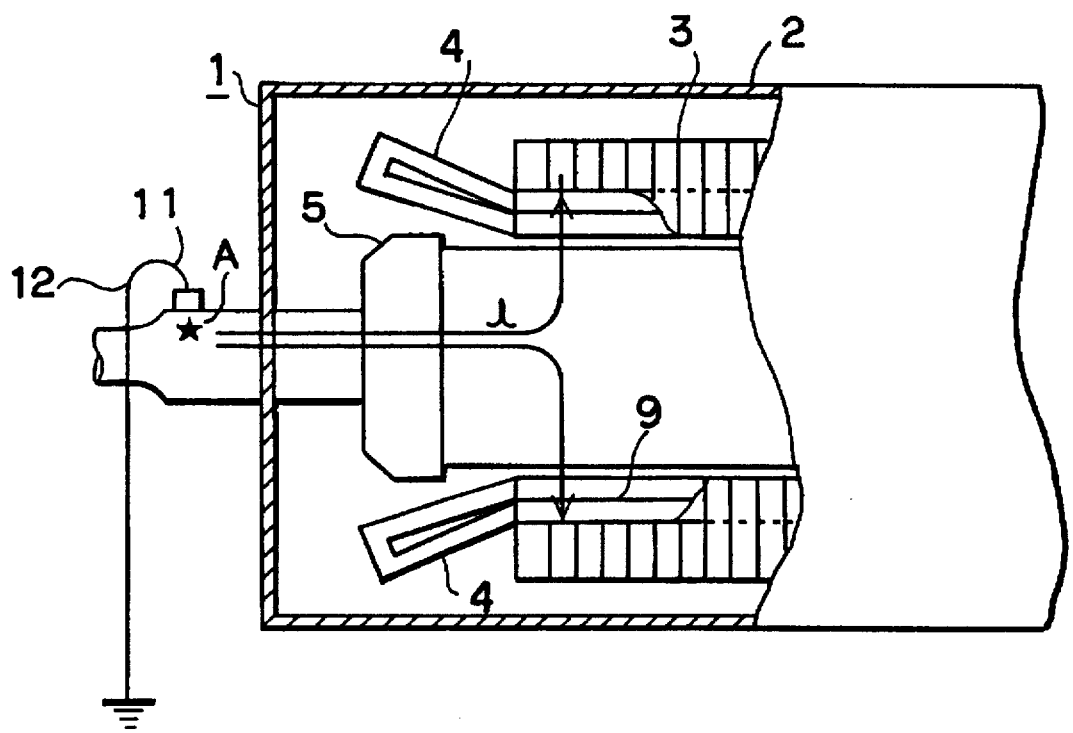
FIG. 27(a) and FIG. 27(b) are explanatory views showing the propagation path of a radio noise to be detected by partial discharge sensors and the characteristics of detected signals respectively in the embodiment 11.
Figure 27:
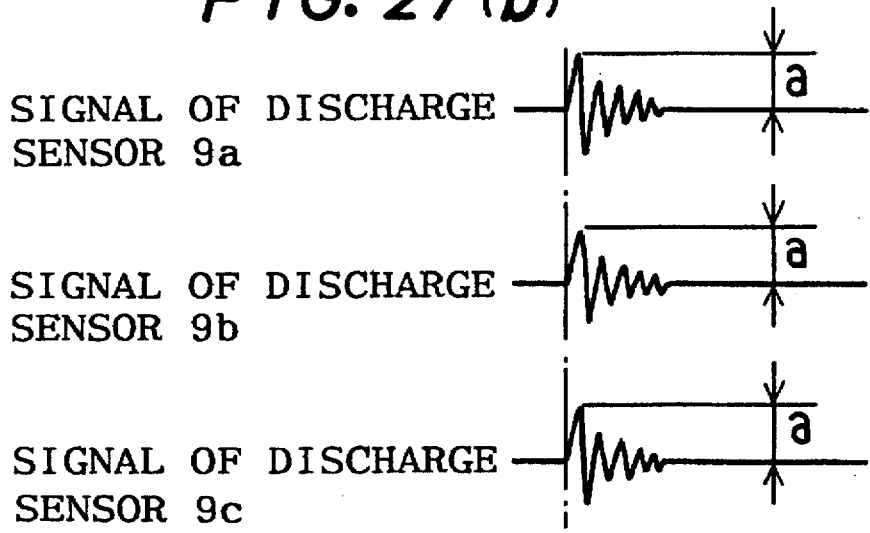
Figure 28:
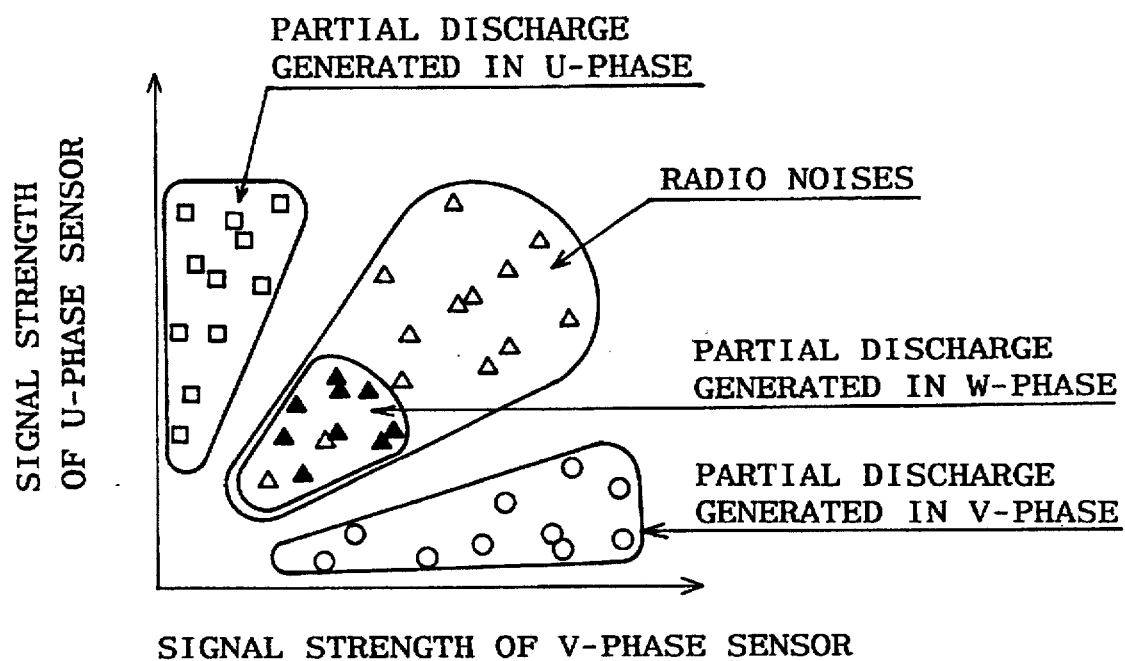
FIG. 28 is a graph showing the relation between U-phase signals and V-phase signals in the embodiment 11.

Hereinafter, the abnormality detecting apparatus for a rotating electric machine of the embodiment 11 of the present invention will be described with referring to drawings. FIG. 25, FIG. 26(a), FIG. 26(b), FIG. 27(a), FIG. 27(b) and FIG. 28 concerns the abnormality detecting apparatus of the embodiment 11. FIG. 25 is a block diagram showing the abnormality detecting apparatus of the embodiment 11. FIG. 26(a), FIG. 26(b), FIG. 27(a) and FIG. 27(b) are explanatory views for illustrating the propagation characteristics of partial discharge signals and radio noises, FIG. 28 is a graph showing the results of the measurement of partial discharge signals and radio noises with the abnormality detecting apparatus. The same reference numerals as those in FIG. 8(a) to FIG. 12 concerning the embodiment 3 are designate the same parts as or the corresponding parts to those of the embodiment 3.

Figure 26A:
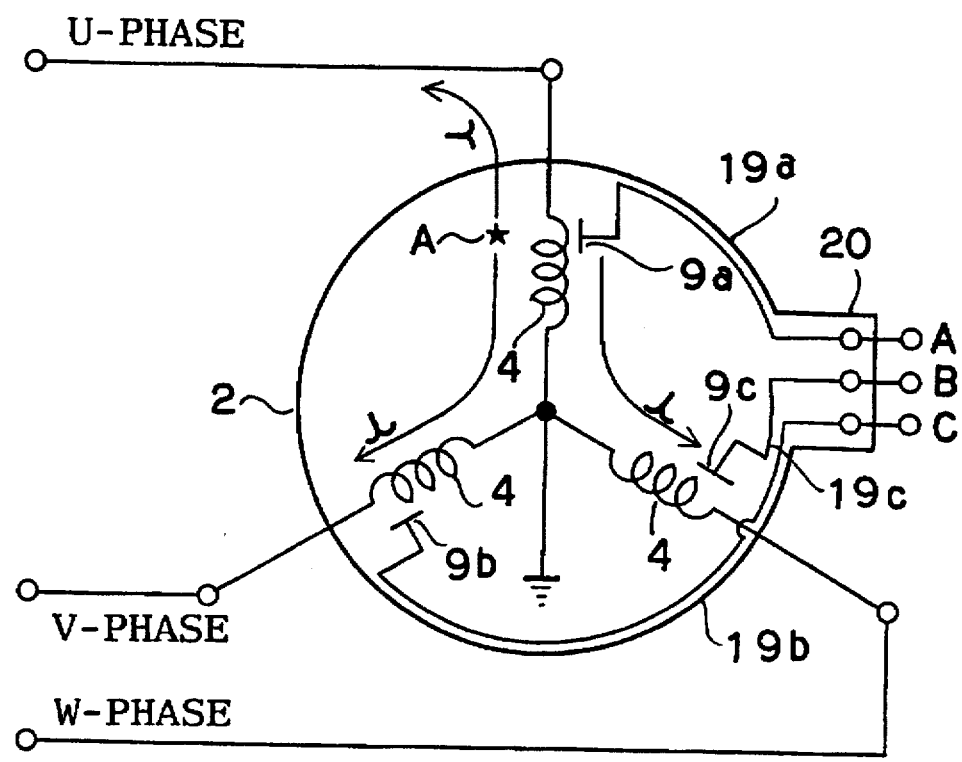
FIG. 26(a) and FIG. 26(b) are explanatory views showing the disposal of stator windings and partial discharge sensors used in the embodiment 11 and the propagation waveforms of partial discharge signals respectively.
Figure 26B:
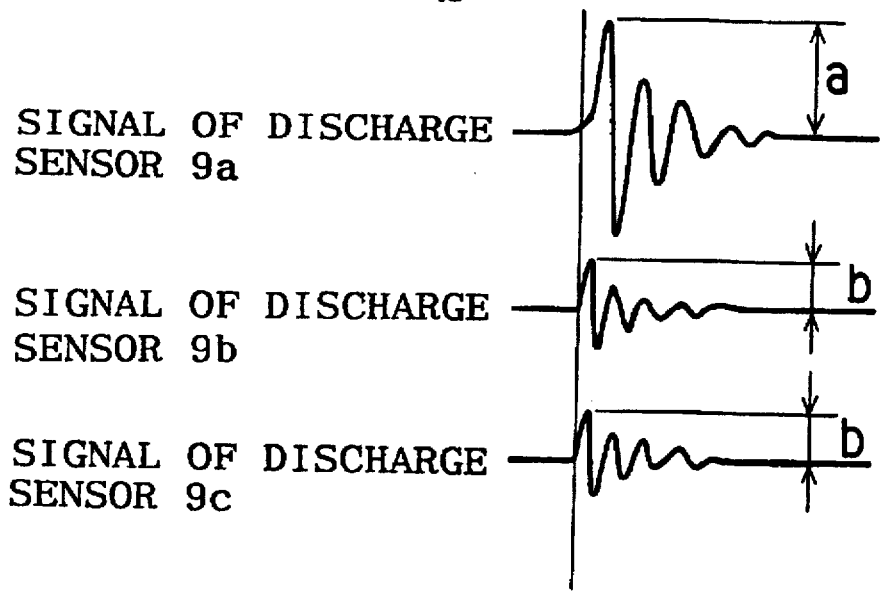

In this embodiment 11, as shown in FIG. 25, FIG. 26(a) and FIG. 26(b), the measuring circuit for the signals detected by the partial discharge sensor 9a which is installed at the U-phase of the stator windings 4 is provided with a noise distinguishing circuit 25a, similarly the measuring circuit for the signals detected by the partial discharge sensor 9b which is installed at the V-phase of the stator windings 4 is provided with a noise distinguishing circuit 25b, and furthermore the measuring circuit for the signals detected by the partial discharge sensor 9c which is installed at the W-phase of the stator windings 4 is provided with a noise distinguishing circuit 25c.

The noise distinguishing circuit 25a is composed of a peak hold circuit 30, an A / D converter 31, a signal strength comparing circuit 32d, a delay circuit 33 and an elimination circuit 34a. And, the noise distinguishing circuit 25b is composed of a peak hold circuit 30, an A / D converter 31, a signal strength comparing circuit 32e, a delay circuit 33 and an elimination circuit 34b. Furthermore, the noise distinguishing circuit 25c is composed of a peak hold circuit 30, an A / D converter 31, a signal strength comparing circuit 32f, a delay circuit 33 and an elimination circuit 34c.

This embodiment is constructed so as to transmit the phases of the voltages of the stator windings 4 to the partial discharge generation processing circuit 26 through a phase detector 36 for detecting the phases of the voltages imposed on the stator windings 4 of a rotating electric machine, namely the phases of the voltages generated at the stator windings 4 of the generator in case of this embodiment.

The constructions of the narrow band filter circuits 23, the display unit 28 and the abnormality displaying apparatus 29 are same as those of the embodiment 3.

Hereinafter, the operation of this apparatus will be described.

As for the embodiments 1 to 9, the methods or the apparatus for detecting partial discharge signals on the basis of the signals detected by one partial discharge sensor were described. On the contrary, in this embodiment, plural partial discharge sensors are equipped in the slots of each phase of the stator windings of a generator to separate partial discharge signals from radio noises by the use of the signals from two or three of the sensors. Furthermore, this construction of this embodiment makes it possible to specify the phases of the generated partial discharge.

Referring to FIG. 25, FIG. 26(a) and FIG. 26(b), the partial discharge sensor 9a is installed in close vicinity to the stator winding 4 of the U-phase, and the detector 10a detects the partial discharge signals of the U-phase. The output signals of the detector 10a are inputted into the narrow band filter 23. The narrow band filter 23 passes only the frequency components in the neighborhood of the resonance frequency $f_0$ determined on the basis of the length of the stator core, and transmits them to the noise distinguishing circuit 25a, like in the embodiment 3.

The noise distinguishing circuit 25a divides the inputted signals into two parts, and the peak values of the signals of one part of the two is detected by the peak hold circuit 30 to be transmitted to the A / D converter 31. The A / D converter 31 converts inputted analogue signals into digital signals to transmit them to the signal strength comparing circuits 32d, 32e and 32f.

In the same way, the digital signals of the partial discharge signals detected at the V-phase are transmitted to the signal strength comparing circuits 32d, 32e and 32f, and the digital signals of the partial discharge signals detected at the W-phase are transmitted to the signal strength comparing circuits 32d, 32e and 32f.

The signal strength comparing circuit 32d compares the U-phase partial discharge signals with the other phase partial discharge signals, namely compares the U-phase partial discharge signals with the V-phase partial discharge signals, and compares the U-phase partial discharge signals with the W-phase partial discharge signals. Thereby, the signal strength comparing circuit 32d separates partial discharge signals from radio noises, and further specifies the phases of the generation of the partial discharge to transmit the results to the elimination circuit 34a.

The method to separate partial discharge signals from radio noises and to specify the phases of the generation of the partial discharge will be described with referring to FIG. 26(a), FIG. 26(b), FIG. 27(a) and FIG. 27(b).

FIG. 26(a) and FIG. 26(b) illustrate the propagation paths of partial discharge signals in the stator windings 4 when the partial discharge is generated in the stator windings 4, and the characteristics of the partial discharge signals detected by the partial discharge sensors 9a, 9b and 9c. For example, in the case where the partial discharge A is generated at the U-phase stator winding 4 as shown in FIG. 6(a), the partial discharge sensor 9a installed in the slot of the U-phase detects the partial discharge signal with almost no attenuation, which signal has a large peak value "a" as shown in FIG. 26(b). On the other hand, the signals to be detected by the partial discharge sensors 9b and 9c of the V-phase and W-phase respectively are attenuated since they are detected after they have been propagated through the stator windings 4, then they are detected by the partial discharge sensors 9b and 9c as the small signals the peak values of which are "b".

In the case where partial discharge is generated at the V-phase or the W-phase, similarly the partial discharge sensor of the phase where the partial discharge is generated detects a larger signal, and the partial discharge sensors of the other phases detects smaller signals.

When the peak values of signals are measured, the lengths of signal cables influence the measured values. But, in this embodiment, the cables are constructed so as to be the same lengths, then only the influences of the propagation paths are related to the peak values.

The noise distinguishing circuits 25a, 25b and 25c are constructed so as to judge the signals detected by two partial discharge sensors within the time differences of 200 ns to be the partial discharge signals from the same generation source under the consideration of the propagation characteristics in the rotating electric machine.

On the other hand, radio noises also are detected by the partial discharge sensors 9. FIG. 27(a) is a fragmentary sectional view typically illustrating, for example, the generator 1 as a rotating electric machine. The rotor 5 is provided with a brush 11 being grounded by a grounding conductor 12 for discharging the voltage on the shaft, which voltage is generated at the rotor 5. It is supposed that radio noises are generated at this part.

When the discharge A is generated at the brush 11 of the rotor 5, which brush 11 is the generation source of radio noises, the discharge signal flows through the grounding conductor 12, and is propagated through the rotor 5 to electrostatically coupled to the stator windings 4 at the same time. Then, the high frequency current flows through the stator windings 4. Simultaneously, the discharge signal is electrostatically coupled to the partial discharge sensors 9a, 9b and 9c, too, then the partial discharge sensors 9a, 9b and 9c detect radio noises. The partial discharge sensors 9a, 9b and 9c detect the signals having the same largeness, the peak values of which are "a", as shown in FIG. 27(b).

The largeness of the detected signals is not related to the positions of the windings of the U-phase, the V-phase and the W-phase and the relation between the stator windings 4 and the partial discharge sensors 9a, 9b and 9c, but the largeness is related to the propagation characteristic formed by the electrostatic coupling between the rotor 5 and the stator windings 4. And, the propagation characteristic is related to the frequency of the discharge signal and the floating electrostatic capacitance determined in accordance with the construction of the rotor 5 and the stator windings 4. The signals to be detected are high frequency signals of 10–50 MHz, and all of the constructions of the stator windings 4 in which the rotor 5 and the partial discharge sensors 9a, 9b and 9c are installed are same, and consequently, the partial discharge sensors 9a, 9b and 9c detect the signals having the same largeness respectively.

It is FIG. 28 that illustrates the results thus measured. The axis of abscissa of FIG. 28 denotes the strength of the partial discharge signals in the U-phase, and the axis of ordinate of FIG. 23 denotes the strength of the partial discharge signals in the V-phase. As is apparent from the figure, the partial discharge generated in the U-phase (□) concentrates towards the axis of ordinate, and the partial discharge generated in the V-phase (○) concentrates towards the axis of abscissa, and further radio noises (△) concentrate at intermediate positions between them. Consequently, partial discharge noises can clearly be separated from radio noises. The partial discharge discharging the small amount of electric charge also can be detected accurately by eliminating radio noises accordingly. Furthermore, the positions where partial discharge signals have been generated can be specified.

The partial discharge signals in the W-phase cannot be distinguished from radio noises from FIG. 28, but the partial discharge signals in the W-phase can similarly be separated by comparing the signal strength between the output signals of the partial discharge sensor 9a in the U-phase and the partial discharge sensor 9c in the W-phase, or by comparing the signal strength between the output signals of the partial discharge sensor 9b in the V-phase and the partial discharge sensor 9c in the W-phase.

As described above, in the abnormality detecting apparatus of this embodiment, the narrow band filter 23 passes the frequency components in the neighborhood of the resonance frequency $f_0$ determined on the basis of the length of the stator core 3 to transmit to the noise distinguishing circuit 25. Then, the noise distinguishing circuit 25 detects the signals from the plural partial discharge sensors 9a, 9b and 9c at the same time to judge the signals having the difference in the signal strength to be the partial discharge signals and the signals having the same signal strength to be radio noises.

Moreover, it becomes possible to specify that the phase where the partial discharge sensor 9 having detected a larger signal among the detected plural signals is installed is the phase of the generation of the partial discharge.

On the execution of the aforementioned judgment and specification, the characteristic amounts of signals are easy to be grasped, since only the signals having the frequencies in the neighborhood of the resonance frequency $f_0$ determined on the basis of the length of the stator core.

Furthermore, the partial discharge generation processing circuit 26 records discharge waveforms, and processes the inputted data into the distributions of the frequencies of the generation of discharge and into the phase characteristics of generated discharge for every generation phase. And, the processed data are recorded and transformed to the display unit 28. Also, the processing circuit 26 records the changes with the passage of time of these various characteristics, and judges the degrees of insulation abnormalities by comparing the processed results with the registered past statistical data and abnormality judging data to transmit the judged data to the display unit 28.

It is very effective information for grasping the insulation abnormalities of a rotating electric machine that the measurement of the generation situation of partial discharge signals for every phase of the stator windings 4 is capable. That is to say, in the case where an insulation abnormality happened in the rotating electric machine, it is required to determine the conditions of operation after the happening in accordance with the places where the abnormality happened and the degree of deterioration, then the capability of the measurement of the generation situation of partial discharge for every phase brings about an effect that it is possible to grasp the information for the judgement of conditions of operation during the operation of the rotating electric machine.

The operation of the display unit 28 and the abnormality displaying apparatus 29 is same as that of the embodiment 3.

Embodiment 12

Figure 29:
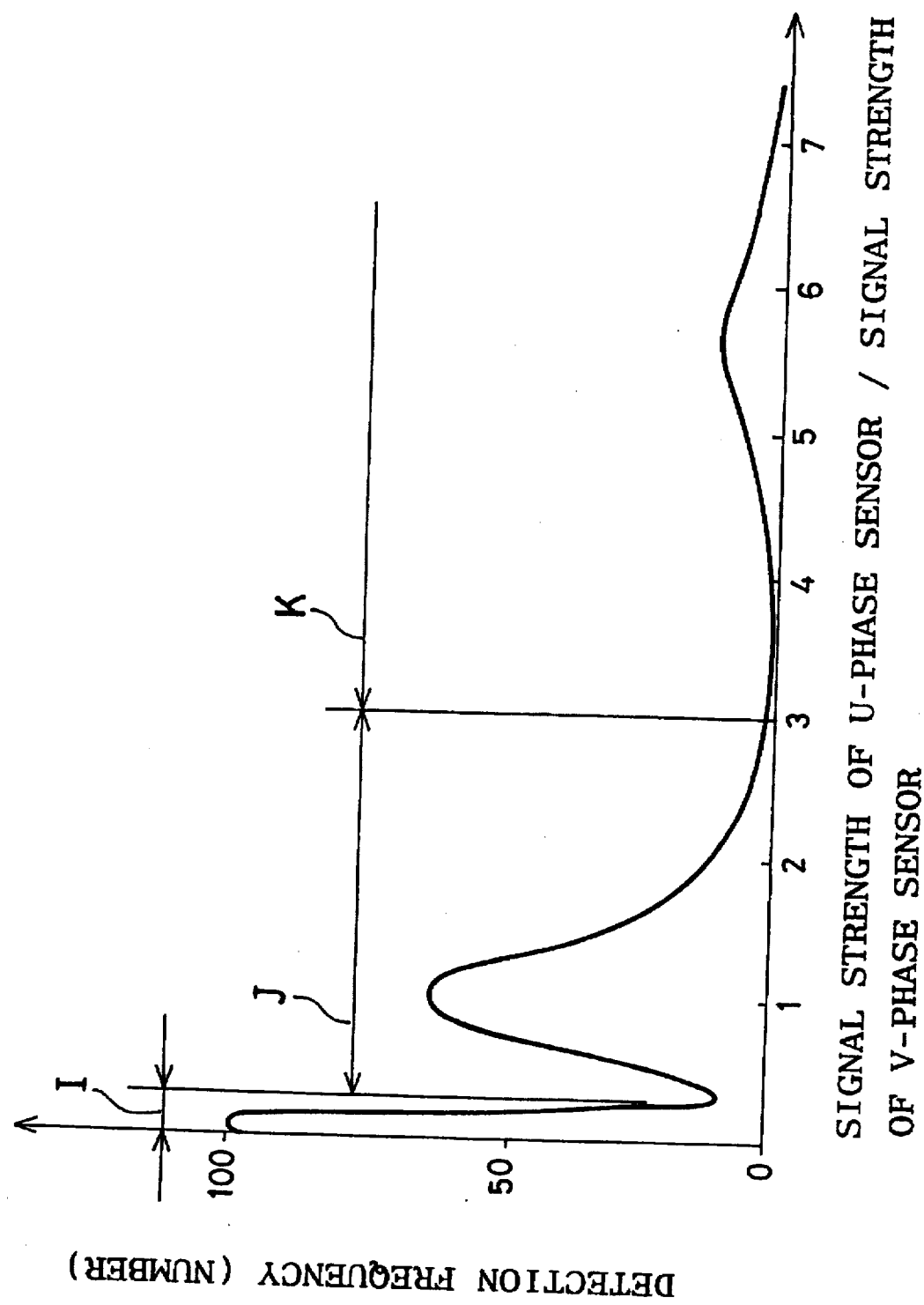
FIG. 29 is a characteristic diagram showing the distribution of the frequencies of detection (the number) vs. the ratios of the output signal strength between partial discharge sensors of the abnormality detecting apparatus for a rotating electric machine of the embodiment 12 of the present invention.

The embodiment 12 concerns the reference value for separating partial discharge signals from radio noises out of the detected signals using the construction of the embodiment 11. FIG. 29 is a characteristic diagram showing the distribution of the frequencies of detection (the number) vs. the ratios of the output signal strength between partial discharge sensors (the output signal strength of the U-phase sensor / the output signal strength of the V-phase sensor in this case) of the abnormality detecting apparatus for a rotating electric machine, for example a generator, of the embodiment 12. The construction of the abnormality detecting apparatus of the embodiment is the same as that of the embodiment 11.

The histogram of the relation between the output signal strength of the U-phase sensor / the output signal strength of the V-phase sensor of partial discharge signals detected during the operation of the generator and the frequencies of detection is drawn as a curved line having three peaks as shown in FIG. 29. The drawn signals are the signals having respectively passed the narrow band filter circuits 23, and the curved line are drawn by plotting the ratios of the output signals from two narrow band filter circuits on the axis of abscissa of the figure. The two peaks of the curved line indicate partial discharge signals and one peak of the curved line indicates radio noises respectively, that is to say, the peaks indicates V-phase discharge signals (I), radio noises (J) and U-phase discharge signals (K) respectively from smaller ratio values. In this case, W-phase discharge signals are contained in the central peak, but there is no problem even if they are treated as radio noises in this case. The value at the bottom of the ravine between the I-peak and the J-peak of FIG. 29 indicates the threshold value of the separation of the V-phase discharge and radio noises, and the value at the bottom of the ravine between the J-peak and the K-peak indicates the threshold value of the separation of the U-phase discharge and radio noises.

Threshold values can be determined similarly in the cases of the strength ratios between the output signals of the V-phase sensor and the W-phase sensor and the strength ratios between the output signals of the W-phase sensor and the U-phase sensor.

Figure 30:
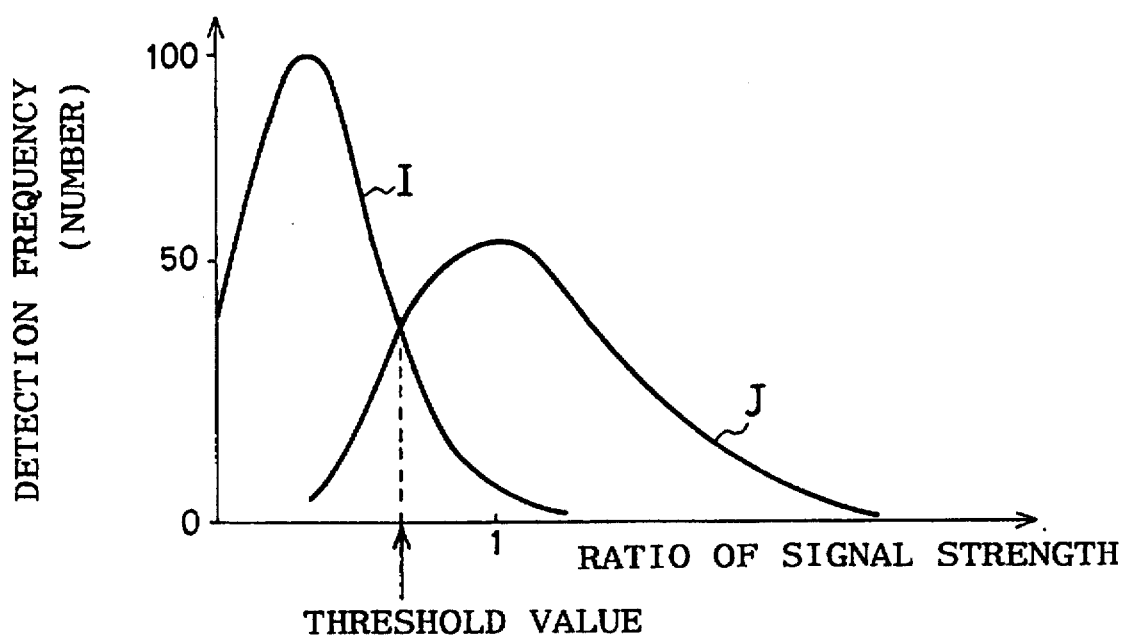
FIG. 30 is a characteristic diagram showing other distributions of the frequencies of detection (the number) vs. the ratios of the strength between partial discharge sensors of the embodiment 12.
Figure 31:
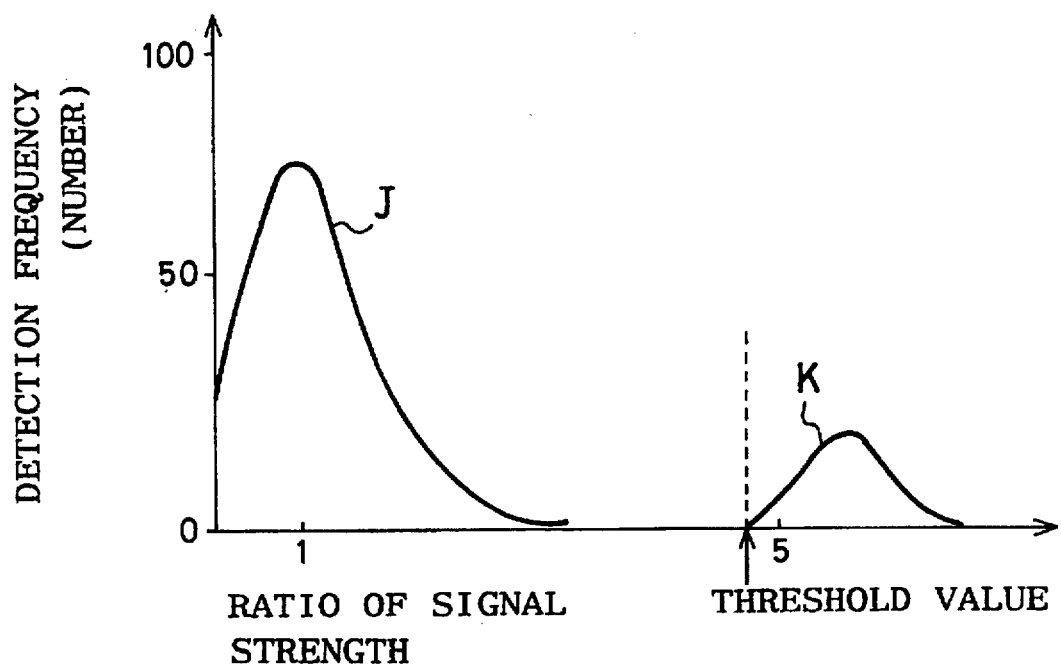
FIG. 31 is a characteristic diagram showing further other distributions of the frequencies of detection (the number) vs. the ratios of the strength between partial discharge sensors of the embodiment 12.

Now, the method of the determination of the threshold values for the separation of signals will be described further in detail. There are a case where the distributions of histograms overlap as shown in FIG. 30 and a case where the distributions of histograms do not overlap as shown in FIG. 31. FIG. 30 illustrates the case where the values at the bases of the peak of partial discharge signals (I) and the peak of radio noises (J) overlap. In this case, the partial discharge signals are separated from radio noises by the use of the value at the point of the intersection of the envelope curves of the histograms as the threshold value.

In the case where the peaks of the partial discharge signals (K) and radio noises (J) do not overlap as shown in FIG. 31, the partial discharge signals are separated from the radio noises by the use of the value of the base of the envelope curve of the partial discharge signals (K) as the threshold value.

By obtaining these threshold values on the generator of the object of measurement in advance and setting them as the threshold values of the signal strength comparing circuits 32d, 32e and 32f, partial discharge signals can precisely be separated from radio noises, and the radio noises can be eliminated by the elimination circuits 34a, 34b and 34c.

Thus, the output signal strength of each partial discharge sensor 9a, 9b and 9c of the stator windings 4 are compared, and the partial discharge generation processing circuit 26 specifies the frequency of the generation of partial discharge, the strength of the generated partial discharge, the phase characteristic of the generated partial discharge and the generated position of the partial discharge by the use of the compared values. The operation of the display unit 28 and the abnormality displaying apparatus 29 is same as that of the embodiment 11.

According to this embodiment, by obtaining the threshold values for separating partial discharge signals from radio noises previously from histograms of a generator, the threshold values for the separation can precisely be determined, even if there somewhat are the errors caused by the differences between the sensitivities of each partial discharge sensor in each phase and the differences between the measuring systems of each phase. Consequently, partial discharge signals can be measured precisely.

Embodiment 13

FIG. 32 is an explanatory table for illustrating the criteria for the judging of partial discharge signals from radio noises in the abnormality detecting apparatus for a rotating electric machine, for example a generator, of the embodiment 13 of the present invention. The construction of the abnormality detecting apparatus of the embodiment 13 is same as that of the embodiment 11. FIG. 32 shows the criteria for judging partial discharge signals from radio noises at the noise distinguishing circuits 25a, 25b and 25c.

In this embodiment, the sensors having the same sensitivities were employed as the partial discharge sensors 9a, 9b and 9c, and the length of the lead wires 19a, 19b and 19c of the partial discharge sensors 9a, 9b and 9c are made to be same. And, by actually measuring the output signals of each partial discharge sensors 9a, 9b and 9c provided in a generator having the rated capacity of 156000 kW and the rated voltage of 18 kV, and by executing statistical analyses for the measured output signal strength of each partial discharge sensor 9a, 9b and 9c by the use of histograms as shown in FIG. 29, threshold values were set as shown in FIG. 32. In this embodiment, $L_1$ in the figure is set to be 3, and $L_2$ in the figure is set to be $\frac{1}{3}$.

For example, the criteria for judging in case of the comparison between the output signal strength of the U-phase partial discharge sensor and the V-phase partial discharge sensor are as follows:

1) The signals detected only by the U-phase partial discharge sensor or the signals fitted to the next relational expression are judged to be the partial discharge signals generated in the U-phase stator winding.

$L_1$ (=3)<the output signal strength of the U-phase / the output signal strength of the V-phase 2) The signals detected only by the V-phase partial discharge sensor or the signals fitted to the next relational expression are judged to be the partial discharge signals generated in the V-phase stator winding.

the output signal strength of the U-phase / the output signal strength of the V-phase <$L_2$ (=$\frac{1}{3}$)

3) The signals fitted to the next relational expression are judged to be radio noises.

$L_1$ (=3)>the output signal strength of the U-phase / the output signal strength of the V-phase>$L_2$ (=$\frac{1}{3}$)

Similarly, in the case where the output signal strength of the V-phase partial discharge sensor and the W-phase partial discharge sensor and the output signal strength of the W-phase partial discharge sensor and the U-phase partial discharge sensor are compared respectively, and further the threshold values of the signal strength comparing circuits 32d, 32e and 32f are set using the values of the results of the comparisons, partial discharge signals can easily be separated from radio noises, and it becomes possible to eliminate the radio noises with the elimination circuits 34a, 34b and 34c.

After the elimination of the radio noises, the partial discharge generation processing circuit 26 specifies the frequency of the generation of partial discharge, the strength of the generated partial discharge, the phase characteristic of the generated partial discharge and the generated position of partial discharge. The operation of the display unit 28 and the abnormality displaying apparatus 29 is the same as that of the embodiment 11.

In this embodiment, the threshold values $L_1$ and $L_2$ are set to be 3 and ⅓ respectively, but the threshold values $L_1$ and $L_2$ are not limited to these values. They may be set to be other values such as the threshold values obtained from the histograms described in regard to the embodiment 12.

Besides, those threshold values $L_1$ and $L_2$ are set to the ratios of the signal strength of the narrow band output signals, but the threshold values $L_1$ and $L_2$ are not limited to be set to them. They may be set to, for example, the difference of the signal strength of the narrow band output signals.

Embodiment 14

Figure 33:
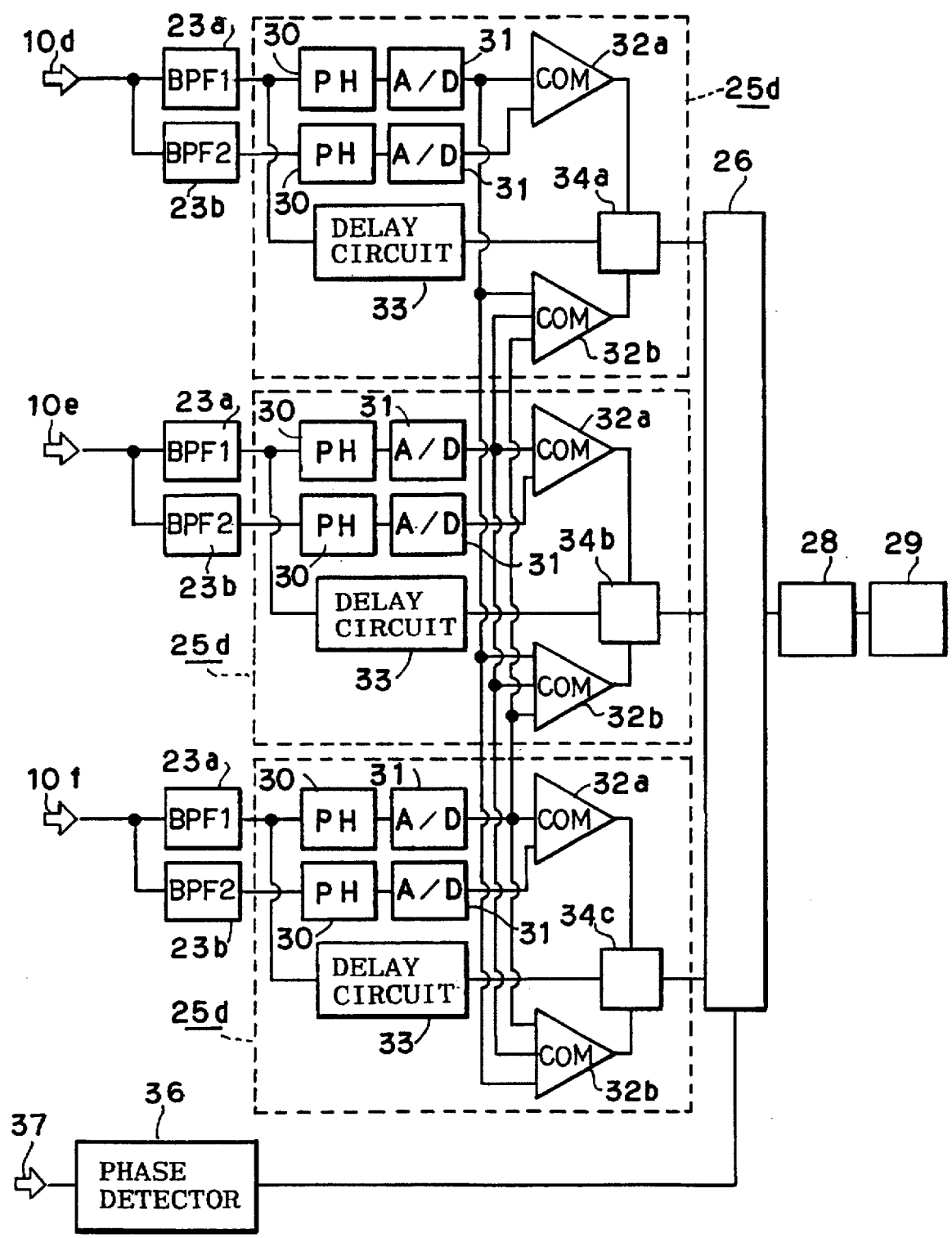
FIG. 33 is a block diagram showing the abnormality detecting apparatus for a rotating electric machine of the embodiment 14 of the present invention.

FIG. 33 is a block diagram showing the abnormality detecting apparatus for a rotating electric machine of the embodiment 14. Referring to the figure, the signal 10d detected by the detector 10a is divided to be inputted into the first narrow band filter circuit 23a and the second narrow band filter circuit 23b, and each of them is transmitted to the signal strength comparing circuit 32a through the peak hold circuit 30 and the A / D converter 31 for transmitting the results of the comparison of the signal strength comparing circuit 32a to the elimination circuit 34a. And, the output signal of the first narrow band filter circuit 23a is divided to be inputted into the aforementioned peak hold circuit 30 and the delay circuit 33 to be transmitted to the elimination circuit 34a. As for the signal 10e detected by the detector 10b and the signal 10f detected by the detector 10c also, the embodiment is constructed so as to process those signals similarly.

That is to say, the abnormality detecting apparatus of the embodiment is provided with circuits in each winding of the U-phase, the V-phase and the W-phase, which circuits compare the strength of the same frequency components as the resonance frequency $f_0$ determined by the length of the stator core and the strength of a predetermined frequency component larger than the resonance frequency $f_0$ by utilizing the frequency characteristics of signals outputted from one partial discharge sensor.

Furthermore, like in the embodiment 11, the strength of the signal 10d which has passed the first narrow band filter circuit 23a, the peak hold circuit 30 and the A / D converter 31, and the strength of the signals 10e and 10f which have passed the circuits corresponding to the circuits which the signal 10d has passed are compared by the signal strength comparing circuits 32b to be transmitted to the elimination circuits 34a, 34b and 34c.

This embodiment is thus constructed to detect the narrow band output signals from the plural partial discharge sensors installed in the U-phase stator winding, the V-phase stator winding and the W-phase stator winding respectively at the same time, and judges the narrow band output signals to be caused by partial discharge in the case where they are different in signal strength, and further judges the narrow band output signals to be caused by a radio noise in the case where they are same in signal strength.

The signals outputted from the elimination circuits 34a, 34b and 34c is transmitted to the partial discharge generation processing circuit 26, the display unit 28 and the abnormality displaying apparatus 29.

Hereinafter, the operation of the embodiment will be described. As described about the embodiment 6, the frequency characteristics of the partial discharge signals and the radio noises generated during the operation of a rotating electric machine and detected by the partial discharge sensor 9 are different from each other owing to the differences of the generation phenomena between the partial discharge phenomena and radio noises, and owing to the differences of the propagation characteristics of these signals to the partial discharge sensor 9. Then, in this embodiment, the signals detected by the partial discharge sensor 9a are passed through the first narrow band filter circuit 23a passing the same frequency component as the frequency $f_0$ determined by the length of the stator core, and through the second narrow band filter circuit. 23b passing a predetermined frequency component larger than the resonance frequency $f_0$, for example a frequency component being two times as large as the resonance frequency $f_0$, and they are judged on the basis of the strength ratios of the signals outputted from the first narrow band filter 23a and the second narrow band filter 23b as follows: the signals having large signal strength ratios were caused by partial discharge and the signals having small signal ratios were caused by radio noises. This operation are done at each of the U-phase measuring system, at the V-phase measuring system and at the W-phase measuring system in parallel with each other.

At the same time, the signals 10d detected by the U-phase partial discharge sensor 9a, the signals 10e detected by the V-phase partial discharge sensor 9b and the signals 10f detected by the W-phase partial discharge sensor 9c are passed through the first narrow band filter circuits 23a, the peak hold circuits 30 and the A / D converters 31 to be compared with each other by the signal strength comparing circuits 32b. The signal strength comparing circuits 32b judge the signals having the strength different from others to be the signals caused by partial discharge and judge the signals having the strength same as that of other signals to be radio noises. The results of the judgement by the signal strength comparing circuits 32b are transmitted to the elimination circuits 34a, 34b and 34c.

On the other hand, the signals passed through the first narrow band filter circuits 23a are delayed by the delay circuits 33 for the period of time necessary for the judgement of the signal strength comparing circuits 23b to be transmitted to the elimination circuits 34a, 34b and 34c. The delayed signals are separated by the elimination circuits 34a, 34b and 34c in accordance with the results of the judgement, and only the partial discharge signals are transmitted to the partial discharge generation processing circuit 26. The constructions and the operation of the partial discharge generation processing circuit 26, the display unit 28 and the abnormality displaying circuit 29 are the same as those of the embodiment 3.

Thus, the abnormality detecting apparatus of the embodiment separates partial discharge Signals from radio noises out of the detected signals on the basis of the difference of the characteristics, and at the same time, separates the partial discharge signals from radio noises on the base of the differences between the signal strength of the output signals of plural partial discharge sensors, too. That is to say, this apparatus separates the partial discharge signals from radio noises out of the same signals by the use of the two methods simultaneously.

Thereby, there can be obtained an effect that it is possible to clearly separate the signals being in the neighborhood of the threshold value of separation and being impossible to be separated definitely in conformity with one method.

That is to say, as described in connection with FIG. 30, the threshold value of separation is set to be the point of intersection where the envelopes of the distributions of histograms in the case where the distributions of the histograms overlap in one separation method. In this case, the data being in the area from the point of intersection to the base value, namely the data smaller than the value at the point of intersection in the frequencies of detection, have the possibility being separated in error. But, it was ascertained that even if the envelopes of the distributions of histograms overlap in the case where the histograms were made in accordance with the strength ratios of the signals detected one partial discharge sensor and being in two different frequency bands like in the cases of the embodiments 5 through 9, the envelopes of the distributions of histograms do not overlap in the case where the same signals are detected by plural partial discharge sensors like in the cases of the embodiments 10 and 11.

Also, it was ascertained that it was proper to detect signals with the apparatus of the embodiments 5 to 9 and grasp their frequency characteristics in order to ascertain whether the signals detected only by one partial discharge sensor among plural partial discharge sensors are certainly the partial discharge signals in the measurement of the abnormality detecting apparatus of the embodiments 10 and 11.

As described above, this embodiment 14 brings about an effect that it is possible to clearly separate the signals being in the neighborhood of the threshold value of separation and being impossible to be separated definitely in conformity with one method.

It will be appreciated from the foregoing description that, according to the first aspect of the present invention, the abnormality detecting method for electric equipment is constructed to measure the frequency spectrum of a signal detected by a discharge sensor provided in the electric equipment, and to determine a resonance frequency from the frequency spectrum on the basis of the electric equipment and its measuring circuit to specify the generation source of the detected signal from the value of the resonance frequency, and consequently, there can be obtained the effect that an abnormality detecting method for electric equipment which can specify the generation source of a partial discharge signal generated during the operation of the electric equipment in the state of its operation can be obtained.

Furthermore, according to the second aspect of the present invention, the abnormality detecting method for electric equipment is constructed to measure the frequency spectrum of a signal detected by a partial discharge sensor for measuring partial discharge in the electric equipment, and to determine a resonance frequency from the frequency spectrum on the basis of the electric equipment and its measuring circuit to detect a partial discharge signal on the basis of the strength of a detected signal having a frequency in the neighborhood of the resonance frequency and the strength of a signal having a predetermined frequency larger than the resonance frequency, and consequently, there can be obtained the effects that an abnormality detecting method for electric equipment which can detect partial discharge generated during the operation of the electric equipment in the state of its operation, and further which can specify a partial discharge signal from every generation source can be obtained.

Furthermore, according to the third aspect of the present invention, the abnormality detecting method for electric equipment is constructed to measure the frequency spectra of signals detected by plural partial discharge sensors for measuring partial discharge in the electric equipment, and to determine a resonance frequency from the frequency spectra on the basis of the electric equipment and its measuring circuit, and further to compare the signal strength in the neighborhood of the resonance frequency, the signals outputted from the plural partial discharge sensors, to specify a detected signal having a different characteristic amount, and consequently, there can be obtained the effect that an abnormality detecting method for electric equipment which can detect partial discharge generated during the operation of the electric equipment in the state of its operation, and further which can specify a partial discharge signal from every generation source can be obtained.

Furthermore, according to the fourth aspect of the present invention, the abnormality detecting apparatus for a rotating machine is constructed to comprise a partial discharge sensor installed in a slot for a stator winding of the rotating electric machine for detecting partial discharge in the slot, a narrow band filter circuit receiving the output signal of the partial discharge sensor and passing the same frequency component as a resonance frequency determined on the basis of the length of the stator core of the rotating electric machine, a partial discharge generation processing circuit executing a process in accordance with the generation of partial discharge, and a display unit displaying a processed result, and consequently, there can be obtained the effect that an abnormality detecting apparatus for a rotating electric machine which can detect partial discharge generated during the operation of the rotating electric machine in the state of its operation widely and precisely can be obtained.

Furthermore, according to the fifth aspect of the present invention, the abnormality detecting apparatus of a rotating electric machine is constructed to comprise a partial discharge sensor being installed in a slot for a stator winding of a rotating electric machine for detecting partial discharge generated at the slot; a first narrow band filter circuit receiving an output signal from the partial discharge sensor and passing a frequency component in the neighborhood of a resonance frequency determined on the basis of the length of a stator core of the rotating electric machine; a second narrow band filter circuit receiving the output signal of the partial discharge sensor and passing a predetermined frequency component larger than the resonance frequency; a noise distinguishing circuit distinguishing a partial discharge signal on the basis of two narrow band output signals from the first narrow band filter circuit and the second narrow band filter circuit, which noise distinguishing circuit has a peak hold circuit, a signal strength comparing circuit, a delay circuit and an elimination circuit; a partial discharge generation processing circuit executing a process in accordance with the generation of partial discharge; and a display unit displaying the result of the process; and consequently, there can be obtained the effects that an abnormality detecting apparatus for a rotating electric machine which can separate partial discharge signals from radio noises to eliminate the radio noises in the state of the operation of the rotating electric machine, which abnormality detecting apparatus can detect the partial discharge discharging the small charge also, can be obtained.

Furthermore, according to the sixth aspect of the present invention, the abnormality detecting apparatus for a rotating electric machine is constructed so that its noise distinguishing circuit comprises a processing circuit calculating the ratio of two narrow band output signals having passed two narrow band filter circuits respectively to obtain a threshold value for separating a partial discharge signal from a radio noise on the basis of the histograms of the signal strength ratio, the noise distinguishing circuit executing the distinction of the partial discharge signal by employing the value of the point of the intersection of the envelopes of the histograms as the threshold value in the case where the two histograms overlap, and by employing a value of the bottom of the envelope of the partial discharge signal as the threshold value in the case where the two histograms do not overlap, and consequently, there can be obtained the effects that an abnormality detecting apparatus for a rotating electric machine which can accurately determine the threshold value of the separation of a partial discharge signal from a radio noise in the state of including the errors caused by a little difference of the sensitivity of partial discharge sensors or the errors somewhat included in the measuring system of partial discharge, which apparatus can precisely measure the partial discharge signal, can be obtained.

Furthermore, according to the seventh aspect of the present invention, the abnormality detecting apparatus for a rotating electric machine is constructed to comprise plural partial discharge sensors being installed in the slots for each phase of a stator winding of a rotating electric machine for detecting the partial discharge generated at the slots; plural narrow band filter circuits receiving output signals from the partial discharge sensors and passing the same frequency components as a resonance frequency determined on the basis of the length of the stator core of the rotating electric machine; a noise distinguishing circuit distinguishing a partial discharge signal on the basis of the mutual strength differences among the narrow band output signals having passed the narrow band filter circuits, which noise distinguishing circuit has a peak hold circuit, a signal strength comparing circuit, a delay circuit and an elimination circuit; a partial discharge generation processing circuit executing a process in accordance with the generation of partial discharge; and a display unit displaying the result of the process; and consequently, there can be obtained the effects that an abnormality detecting apparatus for a rotating electric machine which can clearly separate partial discharge signals from radio noises and can detect the partial discharge signals discharging the small amount of charge also, which apparatus further can specify the occurrence positions of the partial discharge signals can be obtained.

While preferred embodiments of the present invention have been described using specific terms, such description is for illustrative purposes only, and it is to be understood that changes and variations may be made without departing from the spirit or scope of the following claims.

What is claimed is:

1. A defect detecting apparatus that monitors a rotating electric machine, the rotating electric machine having windings, a stator core having a length, and a resonance frequency defined by the length of the stator core, the defect detecting apparatus comprising:

a sensor operatively connected within the windings, the sensor including lead wires connecting the sensor to a temperature measuring instrument;

a detector positioned near the lead wires to detect partial discharge in the lead wires;

a bandpass filter operatively connected to the detector, the bandpass filter having a bandwidth and a center frequency at substantially the resonance frequency; and a processing circuit operatively connected to the bandpass filter, for determining defects based upon the output of the bandpass filter.

2. The defect detecting apparatus according to claim 1, further comprising:

a peak-hold circuit operatively connected to the bandpass filter; and a comparator operatively connected between the peak-hold circuit and the processing circuit.

3. The defect detecting apparatus according to claim 1, wherein the processing circuit is operatively connected to the bandpass filter via a noise distinguishing circuit.

* * * * *